(12) United States Patent
Wu

(10) Patent No.: US 12,729,432 B2
(45) Date of Patent: Sep. 8, 2026

(54) SEMICONDUCTOR DEVICE AND MANUFACTURING METHOD THEREOF

(71) Applicant: AUO Corporation, Hsinchu (TW)

(72) Inventor: Shang-Lin Wu, Hsinchu (TW)

(73) Assignee: AUO Corporation, Hsinchu (TW)

( * ) Notice: Subject to any disclaimer, the term of this patent is extended or adjusted under 35 U.S.C. 154(b) by 1027 days.

(21) Appl. No.: 17/882,617

(22) Filed: Aug. 8, 2022

(65) Prior Publication Data

US 2023/0183858 A1 Jun. 15, 2023

Related U.S. Application Data

(60) Provisional application No. 63/287,695, filed on Dec. 9, 2021.

(30) Foreign Application Priority Data

May 17, 2022 (TW) ................................ 111118368

(51) Int. Cl.
*C23C 16/34* (2006.01)
*C23C 16/40* (2006.01)
*H10D 30/67* (2025.01)

(52) U.S. Cl.
CPC ............ *C23C 16/345* (2013.01); *C23C 16/40* (2013.01); *H10D 30/6713* (2025.01); *H10D 30/6758* (2025.01)

(58) Field of Classification Search
CPC ....... C23C 16/345; C23C 16/40; C23C 16/56; H10D 30/6713; H10D 30/6758;
(Continued)

(56) References Cited

U.S. PATENT DOCUMENTS 8,574,662 B2 11/2013 Lee
11,063,068 B2 7/2021 Jeon et al.
(Continued)

FOREIGN PATENT DOCUMENTS

CN 105097553 11/2015
CN 111162090 5/2020
(Continued)

OTHER PUBLICATIONS

Alain E. Kaloyeros et al 2020 ECS J. Solid State Sci. Technol. 9 063006 (Year: 2020).*

(Continued)

*Primary Examiner* — Uzma Alam
(74) *Attorney, Agent, or Firm* — JCIPRNET

(57) ABSTRACT

A semiconductor device and a manufacturing method of the semiconductor device are provided. The semiconductor device includes a substrate, a first silicon nitride (SiN) layer, a second SiN layer, an oxide insulation layer, and a first metal oxide layer. The first SiN layer is located on or above the substrate. The second SiN layer is located above the first SiN layer. Both the first SiN layer and the second SiN layer include a hydrogen element. The second SiN layer has a hydrogen concentration lower than that of the first SiN layer and a thickness less than that of the first SiN layer. The oxide insulation layer is located on the second SiN layer. The first metal oxide layer is located on the oxide insulation layer. The second SiN layer is located between the first metal oxide layer and the substrate.

12 Claims, 20 Drawing Sheets

(58) Field of Classification Search
CPC .. H10D 86/423; H10D 86/411; H10D 86/451; H10D 86/60; H10D 86/021; H10D 86/0212
See application file for complete search history.

(56) References Cited

U.S. PATENT DOCUMENTS

| | | | | |
|---|---|---|---|---|
| 2011/0143079 | A1 | 6/2011 | Lee | |
| 2014/0037928 | A1 | 2/2014 | Lee | |
| 2018/0151654 | A1* | 5/2018 | Lee | H10D 30/6729 |
| 2018/0190822 | A1 | 7/2018 | Park et al. | |
| 2020/0144309 | A1 | 5/2020 | Jeon et al. | |
| 2020/0303424 | A1* | 9/2020 | Lee | H10D 86/60 |
| 2021/0202541 | A1* | 7/2021 | Lim | H10D 86/481 |
| 2021/0280746 | A1* | 9/2021 | Kim | H01L 25/0753 |
| 2021/0296367 | A1* | 9/2021 | Seo | H10D 86/0223 |
| 2021/0399106 | A1 | 12/2021 | Yamazaki et al. | |

FOREIGN PATENT DOCUMENTS

| | | |
|---|---|---|
| CN | 113016090 | 6/2021 |
| TW | 201125422 | 7/2011 |
| TW | I582945 | 5/2017 |
| TW | I613706 | 2/2018 |

OTHER PUBLICATIONS

Kyung-Chul Ok et al., "The effects of buffer layers on the performance and stability of flexible InGaZnO thin film transistors on polyimide substrates", Applied Physics Letters, vol. 104, Issue 6, Feb. 2014, pp. 063508-1-063508-4.

* cited by examiner

SEMICONDUCTOR DEVICE AND MANUFACTURING METHOD THEREOF

CROSS-REFERENCE TO RELATED APPLICATION

This application claims the priority benefit of U.S. provisional application Ser. No. 63/287,695, filed on Dec. 9, 2021 and Taiwan application serial no. 111118368, filed on May 17, 2022. The entirety of each of the above-mentioned patent applications is hereby incorporated by reference herein and made a part of this specification.

BACKGROUND

Technical Field

The disclosure relates to a semiconductor device and a manufacturing method thereof.

Description of Related Art

At present, common thin film transistors (TFTs) usually apply amorphous silicon (a-Si) semiconductors as channels. Due to the simple manufacturing process and low costs, the a-Si semiconductors have been widely used in various TFTs.

With the progress of display technologies, the resolution of a display panel has been gradually improved year by year. In order to reduce the volume of the TFTs in pixel circuits, a number of manufacturers are dedicated to research and development of new semiconductor materials, such as metal oxide semiconductor materials, which have the advantage of high electron mobility and thus contribute to reducing the size of semiconductor devices. However, metal oxide semiconductors are susceptible to hydrogen in the environment. For instance, a conventional metal oxide semiconductor is often deposited on a silicon nitride (SiN) insulation layer or a silicon oxynitride insulation layer. However, the SiN insulation layer or the silicon oxynitride insulation layer is prone to having a hydrogen element, and the hydrogen element of the silicon oxide insulation layer or the silicon oxynitride insulation layer may diffuse into the metal oxide semiconductor and affect electrical properties of the metal oxide semiconductor.

SUMMARY

The disclosure provides a semiconductor device and a manufacturing method thereof capable of mitigating a negative impact of a hydrogen element of a silicon nitride (SiN) layer on a metal oxide layer.

At least one embodiment of the disclosure provides a semiconductor device. The semiconductor device includes a substrate, a first SiN layer, a second SiN layer, an oxide insulation layer, and a first metal oxide layer. The first SiN layer is located on or above the substrate. The second SiN layer is located above the first SiN layer. The first SiN layer and the second SiN layer both include a hydrogen element, a hydrogen concentration of the second SiN layer is lower than a hydrogen concentration of the first SiN layer, and a thickness of the second SiN layer is less than a thickness of the first SiN layer. The oxide insulation layer is located on the second SiN layer. The first metal oxide layer is located on the oxide insulation layer. The second SiN layer is located between the first metal oxide layer and the substrate.

At least one embodiment of the disclosure provides a manufacturing method of a semiconductor device, and the manufacturing method includes following steps. A first SiN layer is formed on or above a substrate. A second SiN layer is formed above the first SiN layer, wherein the first SiN layer and the second SiN layer both include a hydrogen element, a hydrogen concentration of the second SiN layer is lower than a hydrogen concentration of the first SiN layer, and a thickness of the second SiN layer is less than a thickness of the first SiN layer. An oxide insulation layer is formed on the second SiN layer. A first metal oxide layer is formed on the oxide insulation layer, wherein the second SiN layer is located between the first metal oxide layer and the substrate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
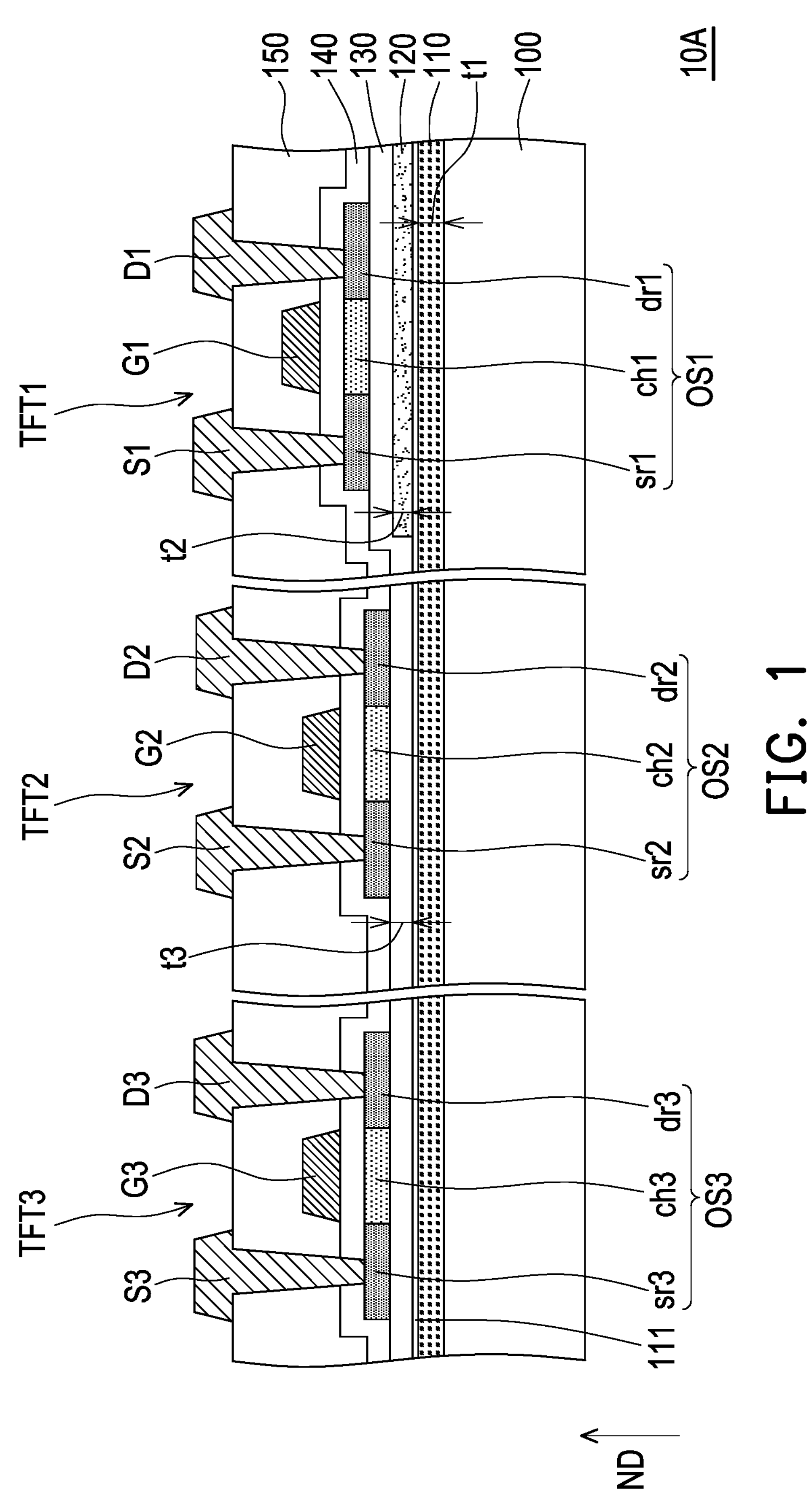
FIG. 1 is a schematic cross-sectional view illustrating a semiconductor device according to an embodiment of the disclosure.

FIG. 1 is a schematic cross-sectional view illustrating a semiconductor device according to an embodiment of the disclosure.

With reference to FIG. 1, a semiconductor device 10A includes a substrate 100, a first silicon nitride (SiN) layer 110, a second SiN layer 120, an oxide insulation layer 130, and a first metal oxide layer OS1. In this embodiment, the semiconductor device 10A further includes a second metal oxide layer OS2, a third metal oxide layer OS3, a gate dielectric layer 140, and interlayer dielectric layer 150, a first gate G1, a second gate G2, a third gate G3, a first source S1, a first drain D1, a second source S2, a second drain D2, a third source S3, and a third drain D3.

A material of the substrate 100 may be glass, quartz, organic polymer, or an opaque/reflective material (e.g., a conductive material, metal, wafer, a ceramic material, or any other applicable material), or any other applicable material. If the substrate 100 is made of the conductive material or metal, the substrate 100 is covered by an insulation layer (not shown) to prevent short circuit. In some embodiments, the substrate 100 is a flexible substrate, and a material of the substrate 100 is, for instance, polyethylene terephthalate (PET), polyethylene naphthalate (PEN), polyester (PES), polymethylmethacrylate (PMMA), polycarbonate (PC), polyimide (PI), a metal foil, or any other flexible material.

The first SiN layer 110 is located on or above the substrate 100. In some embodiments, other insulation layers, conductive layers, or semiconductor layers are further included between the first SiN layer 110 and the substrate 100, which should however not be construed as a limitation in the disclosure. In this embodiment, the first SiN layer 110 is directly formed on the substrate 100. The first SiN layer 110 is adapted to prevent metal ions in the substrate 100 from being diffused upward in the manufacturing process, thereby preventing the metal oxide layer from being affected by the metal ions in the substrate 100.

The second SiN layer 120 is located above the first SiN layer 110. In this embodiment, the oxide layer 111 is located on an upper surface of the first SiN layer 110, and the first SiN layer 110 and the oxide layer 111 are located between the second SiN layer 120 and the substrate 100. A lower surface of the second SiN layer 120 directly contacts an upper surface of the oxide layer 111. In some embodiments, a material of the oxide layer 111 includes silicon oxide or any other suitable material.

Both the first SiN layer 110 and the second SiN layer 120 include a hydrogen element. For instance, the gas applied for depositing the first SiN layer 110 and the second SiN layer 120 includes a hydrogen element, so that both the first SiN layer 110 and the second SiN layer 120 include the hydrogen element. The first SiN layer 110 and the second SiN layer 120 are formed by applying different process parameters, and a hydrogen concentration of the second SiN layer 120 is lower than a hydrogen concentration of the first SiN layer 110. In some embodiments, the hydrogen concentration of the first SiN layer 110 is higher than or equal to 20 at % and lower than or equal to 35 at %, and the hydrogen concentration of the second SiN layer 120 is higher than or equal to 5 at % and lower than 20 at %. In some embodiments, a density of the second SiN layer 120 is greater than a density of the first SiN layer 110; namely, the second SiN layer 120 is denser than the first SiN layer 110. In some embodiments, the density of the second SiN layer 120 is greater than or equal to 2.75 $g/cm^3$.

According to some embodiments, in the process of depositing the second SiN layer 120, the resultant residual stress to the underlying components (e.g., the substrate 100) is greater than the resultant residual stress to the underlying component (e.g., the substrate 100) in the process of depositing the first SiN layer 110; therefore, in order to reduce damages to the underlying components in the process of depositing the second SiN layer 120, a thickness t2 of the second SiN layer 120 is less than a thickness t1 of the first SiN layer 110. In some embodiments, the thickness t1 of the first SiN layer 110 and the thickness t2 of the second SiN layer 120 are 100 angstroms to 3000 angstroms.

The oxide insulation layer 130 is located on the first SiN layer 110 and the second SiN layer 120. In this embodiment, the oxide insulation layer 130 directly contacts the upper surface of the oxide layer 111 and an upper surface of the second SiN layer 120. A material of the oxide insulation layer 130 is, for instance, silicon oxide, silicon oxynitride, or any suitable insulation material. In some embodiments, a thickness t3 of the oxide insulation layer 130 is 200 angstroms to 3000 angstroms.

The first metal oxide layer OS1, the second metal oxide layer OS2, and the third metal oxide layer OS3 are located on the oxide insulation layer 130. In this embodiment, the first metal oxide layer OS1, the second metal oxide layer OS2, and the third metal oxide layer OS3 directly contact the upper surface of the oxide insulation layer 130.

In some embodiments, a material of the first metal oxide layer OS1, the second metal oxide layer OS2, and the third metal oxide layer OS3 includes indium gallium tin zinc oxide (IGTZO) or indium gallium zinc oxide (IGZO), indium tin zinc oxide (ITZO), aluminum zinc tin oxide (AZTO), indium tungsten zinc oxide (IWZO), and other quaternary metal compounds, oxides constituted by any three of gallium (Ga), zinc (Zn), indium (In), tin (Sn), aluminum (Al), tungsten (W)(Ga), or lanthanide rare earth doped metal oxide (such as Ln-IZO). The first metal oxide layer OS1 includes a source region sr1, a drain region dr1, and a channel region ch1 located between the source region sr1 and the drain region dr1, the second metal oxide layer OS2 includes a source region sr2, a drain region dr2, and a channel region ch2 located between the source region sr2 and the drain region dr2, and the third metal oxide layer OS3 includes a source region sr3, a drain region dr3, and a channel region ch3 located between the source region sr3 and the drain region dr3. In some embodiments, the source regions sr1-sr3 and the drain regions dr1-dr3 are doped to have a resistivity lower than a resistivity of the channel regions ch1-ch3. For instance, a hydrogen concentration of the source regions sr1-sr3 and drain regions dr1-dr3 is higher than a hydrogen concentration of the channel regions ch1-ch3.

The second SiN layer 120 is located between the first metal oxide layer OS1 and the substrate 100. The first SiN layer 110 is located between the first metal oxide layer OS1 and the substrate 100, between the second metal oxide layer OS2 and the substrate 100, and between the third metal oxide layer OS3 and the substrate 100. The second SiN layer 120 is not overlapped with the second metal oxide layer OS2 and the third metal oxide layer OS3 in a normal direction ND of an upper surface of the substrate 100. In this embodiment, since the hydrogen element is not apt to be diffused in the second SiN layer 120, the second SiN layer 120 may block the hydrogen element in the first SiN layer 110 and prevent the hydrogen element from being diffused into the first metal oxide layer OS1. In addition, it is easier for the hydrogen element of the first SiN layer 110 to be diffused into the second metal oxide layer OS2 and the third metal oxide layer OS3 rather than being diffused into the first metal oxide layer OS1. In view the above, the hydrogen concentration of the channel region ch1 of the first metal oxide layer OS1 is lower than the hydrogen concentration of the channel region ch2 of the second metal oxide layer OS2 and the hydrogen concentration of the channel region ch3 of the third metal oxide layer OS3.

The gate dielectric layer 140 is located on the first metal oxide layer OS1, the second metal oxide layer OS2, and the third metal oxide layer OS3. In some embodiments, a material of the gate dielectric layer 140 includes silicon oxide, silicon oxynitride, hafnium oxide, aluminum oxide, or any other suitable material.

The first gate G1, the second gate G2, and the third gate G3 are located on the gate dielectric layer 140 and are respectively overlapped with the first metal oxide layer OS1, the second metal oxide layer OS2, and the third metal oxide layer OS3 in the normal direction ND of the upper surface of the substrate 100. In some embodiments, a material of the first gate G1, the second gate G2, and the third gate G3 may include metal, such as chromium (Cr), gold (Au), silver (Ag), copper (Cu), Sn, lead (Pb), hafnium (Hf), W, molybdenum (Mo), neodymium (Nd), titanium (Ti), tantalum (Ta), Al, Zn, or an alloy of any combination of the above metals, or a stacked layer of the above metals and/or alloys, which should however not be construed as a limitation in the disclosure. The first gate G1, the second gate G2, and the third gate G3 may also be made of other conductive materials, such as metal nitrides, metal oxides, metal nitride oxides, stacked layers of metals and other conductive materials, or any other material with conductive properties.

The interlayer dielectric layer 150 is located on the gate dielectric layer 140. The interlayer dielectric layer 150 covers the first gate G1, the second gate G2, and the third gate G3. In some embodiments, a material of the interlayer dielectric layer 150 includes silicon oxide, SiN, silicon oxynitride, hafnium oxide, aluminum oxide, or any other insulation material.

The first source S1, the first drain D1, the second source S2, the second drain D2, the third source S3, and the third drain D3 are located on the interlayer dielectric layer 150. The first source S1 and the first drain D1 are electrically connected to the source region sr1 and the drain region dr1 of the first metal oxide layer OS1. The second source S2 and the second drain D2 are electrically connected to the source region sr2 and the drain region dr2 of the second metal oxide layer OS2. The third source S3 and the third drain D3 are electrically connected to the source region sr3 and the drain region dr3 of the third metal oxide layer OS3. In some embodiments, a material of the first source S1, the first drain D1, the second source S2, the second drain D2, the third source S3, and the third drain D3 may include metal, such as Cr, Au, Ag, Cu, Sn, Pb, Hf, W, Mo, Nd, Ti, Ta, Al, Zn, or an alloy of any combination of the above metals, or a stacked layer of the above metals and/or alloys, which should however not be construed as a limitation in the disclosure. The first source S1, the first drain D1, the second source S2, the second drain D2, the third source S3, and the third drain D3 may also be made of other conductive materials, such as metal nitrides, metal oxides, metal nitride oxides, stacked layers of metals and other conductive materials, or any other material with conductive properties.

In this embodiment, the first thin film transistor TFT1 includes the first metal oxide layer OS1, the first gate G1, the first source S1, and the first drain D1, the second thin film transistor TFT2 includes the second metal oxide layer OS2, the second gate G2, the second source S2, and the second drain D2, and the third thin film transistor TFT3 includes the third metal oxide layer OS3, the third gate G3, the third source S3, and the third drain D3. The first thin film transistor TFT1, the second thin film transistor TFT2, and the third thin film transistor TFT3 may be disposed in different regions on the substrate 100 according to actual requirements.

In view of the above, the second SiN layer 120 may mitigate the impact of the hydrogen element on the first metal oxide layer OS1, thereby reducing the hydrogen concentration of the first metal oxide layer OS1. In addition, in this embodiment, the first metal oxide layer OS1 with a lower hydrogen concentration and the second metal oxide layer OS2 and the third metal oxide layer OS3 with a higher hydrogen concentration may be formed, so as to obtain the thin film transistors with different characteristics.

FIG. 2A to FIG. 2F are schematic cross-sectional views illustrating a manufacturing method of the semiconductor device 10A depicted in FIG. 1.

Figure 2A:
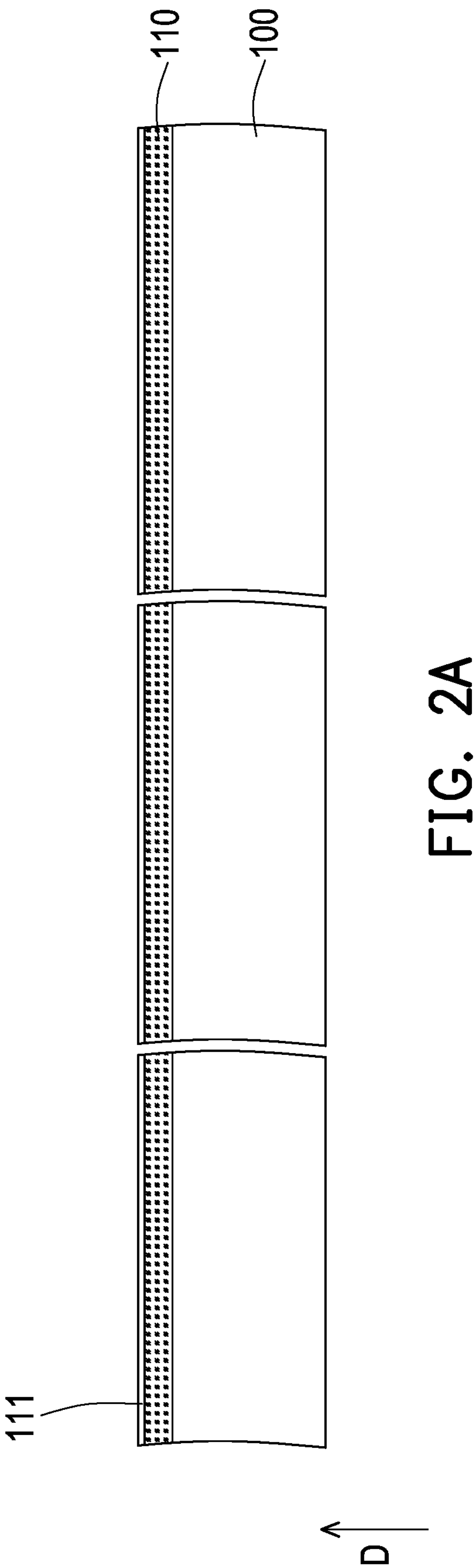
FIG. 2A to FIG. 2F are schematic cross-sectional views illustrating a manufacturing method of the semiconductor device depicted in FIG. 1.

With reference to FIG. 2A, a first SiN layer 110 is formed on the substrate 100. For instance, the first SiN layer 110 blanketing the substrate 100 is formed by performing chemical vapor deposition (CVD) or plasma enhanced chemical vapor deposition (PECVD). In some embodiments, the method of depositing the first SiN layer 110 includes: providing silane ($SiH_4$), a nitrogen gas ($N_2$), and an ammonia gas ($NH_3$) on the substrate 100 and enabling them to react to generate hydrogenated silicon nitride (SiN:H). In some embodiments, a flux of the $SiH_4$ for depositing the first SiN layer 110 is 150 sccm to 300 sccm, a flux of the $N_2$ for depositing the first SiN layer 110 is 5000 sccm to 12000 sccm, and a flux of the $NH_3$ for depositing the first SiN layer 110 is 100 sccm to 650 sccm. According to some embodiments, in the process of depositing the first SiN layer 110, the pressure is 120 Pa to 230 Pa (or 150 Pa to 230 Pa), the temperature is 260° C. to 380° C., and the power applied for depositing the first SiN layer 110 is 1000 W to 2000 W. Next, the oxide layer 111 is formed on the first SiN layer 110.

Figure 2B:
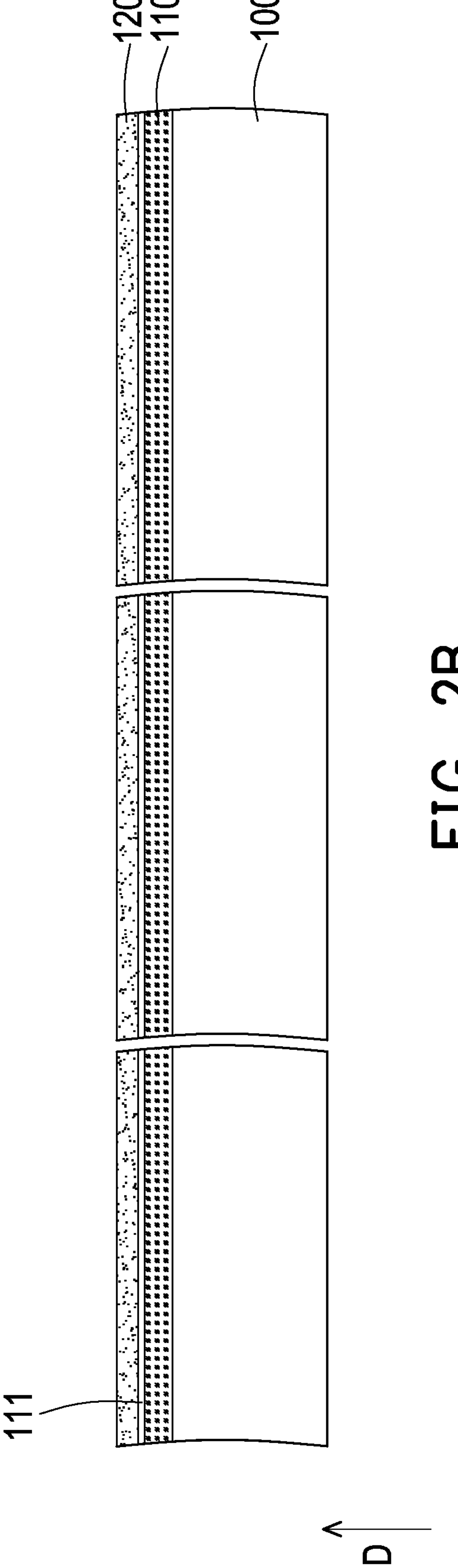
Figure 2C:
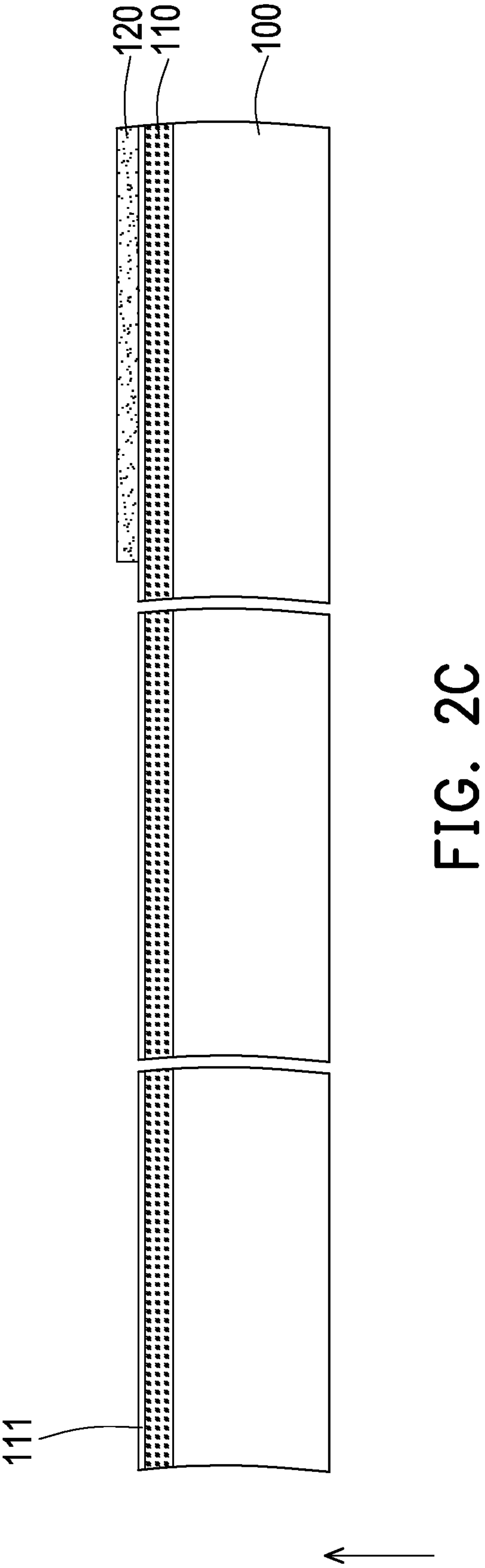

With reference to FIG. 2B and FIG. 2C, the second SiN layer 120 is formed above the first SiN layer 110. First, as shown in FIG. 2B, a SiN material layer 120' is formed on the oxide layer 111. For instance, the SiN material layer 120' blanketing the oxide layer 111 is formed by performing CVD or PECVD. In some embodiments, the method of depositing the SiN material layer 120' includes: providing $SiH_4$, $N_2$, and $NH_3$ on the substrate 100 and enabling them to react to generate SiN. In some embodiments, the flux of the $SiH_4$ for depositing the SiN material layer 120' is 150 sccm to 300 sccm, the flux of the $N_2$ for depositing the SiN material layer 120' is 9000 sccm to 12000 sccm, and the flux of the $NH_3$ for depositing the SiN material layer 120' is 60 sccm to 150 sccm. According to some embodiments, in the process of depositing the SiN material layer 120', the pressure is 70 Pa to 110 Pa, the temperature is 260° C. to 380° C., and the power applied for depositing the SiN material layer 120' is 2000 W to 3000 W.

Next, with reference to FIG. 2C, hydrofluoric acid with a concentration of 0.5 wt % is applied at a temperature higher than or equal to 20° C. and lower than or equal to 25° C. to etch the SiN material layer 120', so as to obtain the second SiN layer 120, wherein an etching rate of the second SiN layer 120 is less than or equal to 2 nanometers/minutes. The second SiN layer 120 covers one portion of the upper surface of the oxide layer 111 and exposes the other portion of the upper surface of the oxide layer 111. The oxide layer 111 may serve as an etching stop layer for the aforementioned etching process.

Figure 2D:
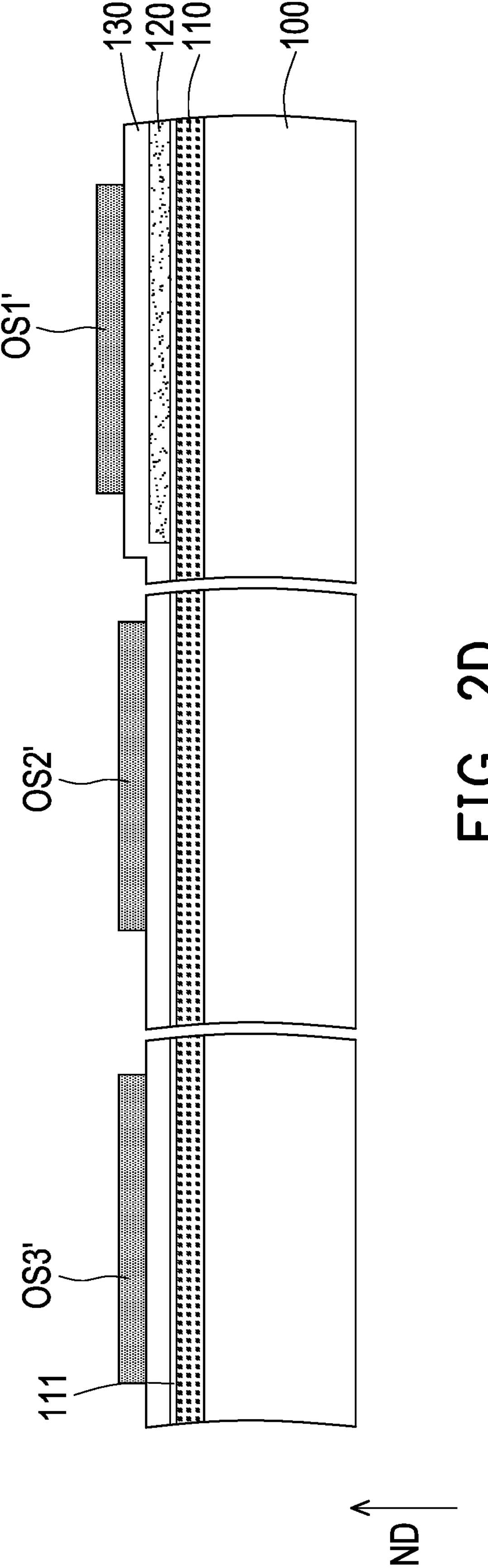

With reference to FIG. 2D, the oxide insulation layer 130 is formed on the first SiN layer 110 and the second SiN layer 120. A first metal oxide layer OS1', a second metal oxide layer OS2', and a third metal oxide layer OS3' are formed on the oxide insulation layer 130. The method of forming the first metal oxide layer OS1', the second metal oxide layer OS2', and the third metal oxide layer OS3' includes following steps. First, a semiconductor material layer (not shown) blanketing the oxide insulation layer 130 is formed. A patterned photoresist (not shown) is formed on the semiconductor material layer by performing a photolithographic process. A wet or dry etching process is performed on the semiconductor material layer by applying the patterned photoresist as a mask, so as to form the first metal oxide layer OS1', the second metal oxide layer OS2', and the third metal oxide layer OS3'. After that, the patterned photoresist is removed. In other words, the first metal oxide layer OS1', the second metal oxide layer OS2', and the third metal oxide layer OS3' belong to the same patterned film layer.

The second SiN layer 120 is located between the first metal oxide layer OS1' and the substrate 100. The first SiN layer 110 is located between the first metal oxide layer OS1' and the substrate 100, between the second metal oxide layer OS2' and the substrate 100, and between the third metal oxide layer OS3' and the substrate 100.

Figure 2E:
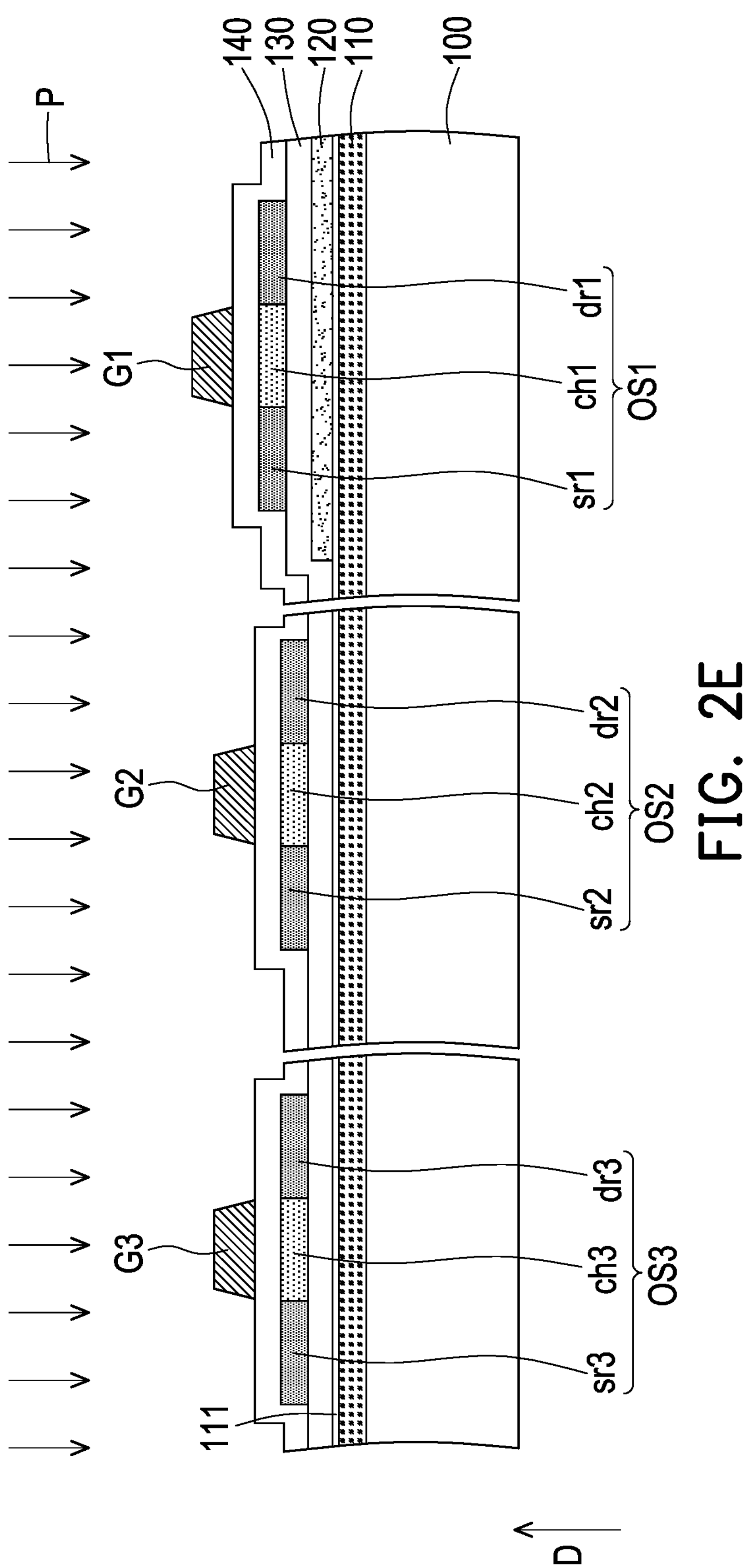

With reference to FIG. 2E, the gate dielectric layer 140 is formed on the first metal oxide layer OS1', the second metal oxide layer OS2', and the third metal oxide layer OS3'. The first gate G1, the second gate G2, and the third gate G3 are formed on the gate dielectric layer 140. In some embodiments, the method of forming the first gate G1, the second gate G2, and the third gate G3 includes a photolithography and etching process. In some embodiments, the first gate G1, the second gate G2, and the third gate G3 belong to the same patterned film layer, and the first gate G1, the second gate G2, and the third gate G3 are made of the same material and have the same thickness.

The first gate G1, the second gate G2, and the third gate G3 are respectively overlapped with the first metal oxide layer OS1', the second metal oxide layer OS2', and the third metal oxide layer OS3' in the normal direction ND of the upper surface of the substrate 100.

A doping process P is performed on the first metal oxide layer OS1', the second metal oxide layer OS2', and the third metal oxide layer OS3' by applying the first gate G1, the second gate G2 and the third gate G3 as masks, so as to form the first metal oxide layer OS1 including the source region sr1, the drain region dr1, and the channel region ch1, the second metal oxide layer OS2 including the source region sr2, the drain region dr2, and the channel region ch2, and the third metal oxide layer OS3 including the source region sr3, the drain region dr3, and the channel region ch3. Through performing the doping process P, the resistivity of the source regions sr1-sr3 and the drain regions dr1-dr3 may be reduced. In this embodiment, in the normal direction ND of the upper surface of the substrate 100, the channel region ch1, the channel region ch2, and the channel region ch3 are respectively overlapped with the first gate G1, the second gate G2, and the third gate G3. In some embodiments, the doping process P is, for instance, a hydrogen plasma process or any other suitable process.

Figure 2F:
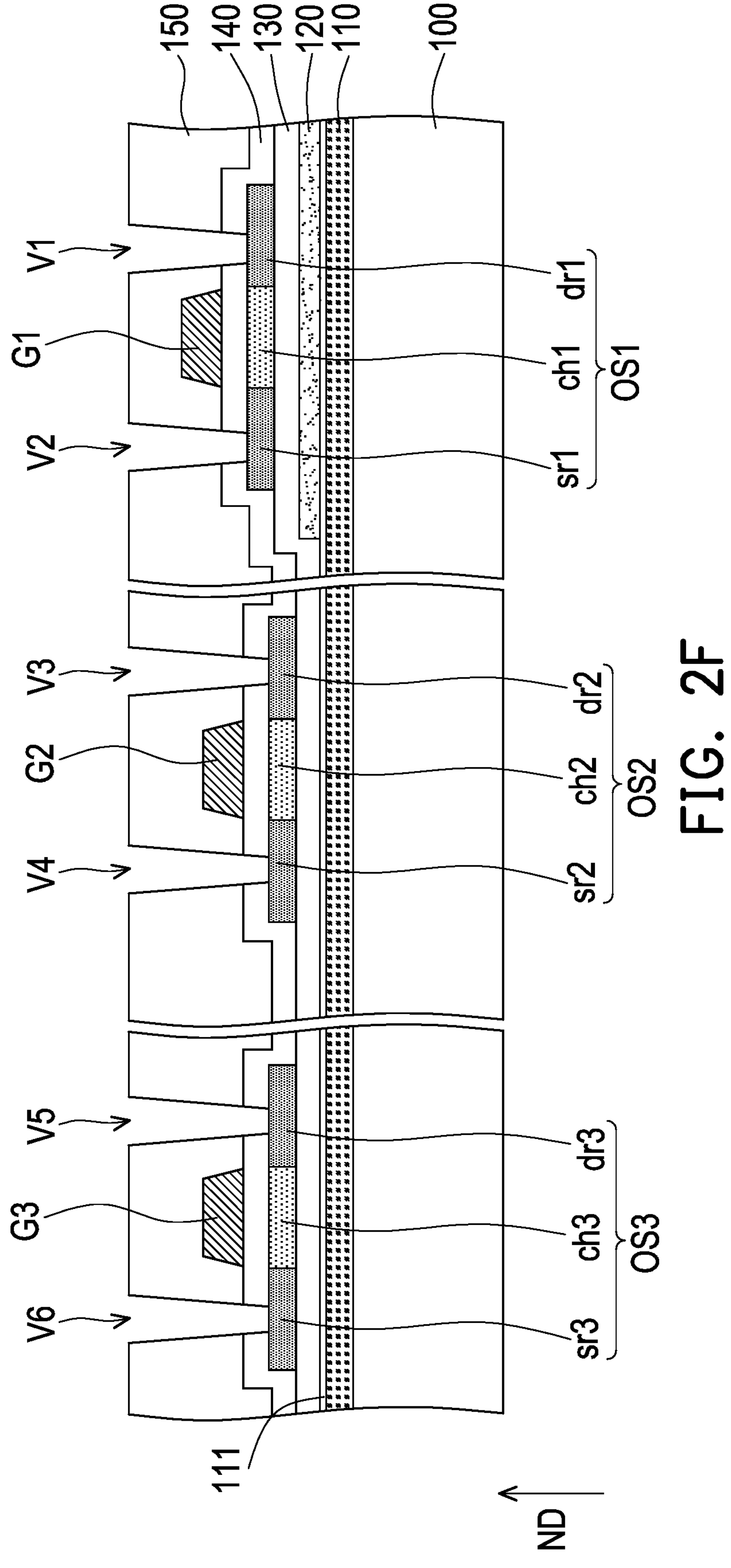

With reference to FIG. 2F, the interlayer dielectric layer 150 is formed on the gate dielectric layer 140. The interlayer dielectric layer 150 covers the first gate G1, the second gate G2, and the third gate G3. At least one etching process is performed to form a first contact hole V1, a second contact hole V2, a third contact hole V3, a fourth contact hole V4, a fifth contact hole V5, and a sixth contact hole V6 penetrating the interlayer dielectric layer 150 and the gate dielectric layer 140. The first contact hole V1 and the second contact hole V2 are overlapped with and expose the drain region dr1 and the source region sr1 of the first metal oxide layer OS1. The third contact hole V3 and the fourth contact hole V4 are overlapped with and expose the drain region dr2 and the source region sr2 of the second metal oxide layer OS2. The fifth contact hole V5 and the sixth contact hole V6 are overlapped with and expose the drain region dr3 and the source region sr3 of the third metal oxide layer OS3.

Finally, with reference to FIG. 1, the first source S1, the first drain D1, the second source S2, the second drain D2, the third source S3, and the third drain D3 are formed on the interlayer dielectric layer 150. The first drain D1 and the first source S1 are located in the first contact hole V1 and the second contact hole V2, respectively. The second drain D2 and the second source S2 are located in the third contact hole V3 and the fourth contact hole V4, respectively. The third drain D3 and the third source S3 are located in the fifth contact hole V5 and the sixth contact hole V6, respectively. So far, the fabrication of the semiconductor device 10A is substantially completed.

Figure 3:
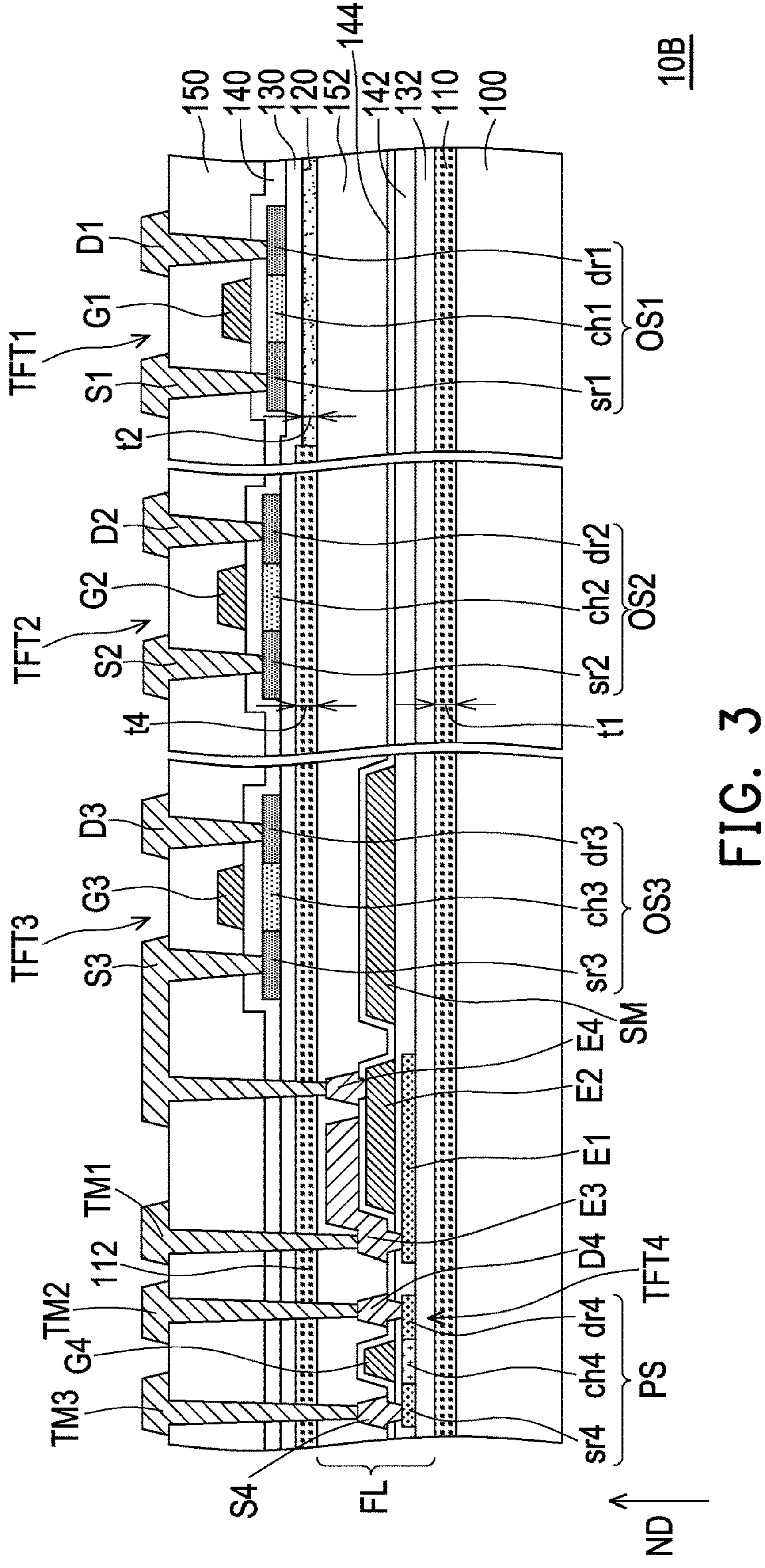
FIG. 3 is a schematic cross-sectional view illustrating a semiconductor device according to an embodiment of the disclosure.

FIG. 3 is a schematic cross-sectional view illustrating a semiconductor device according to an embodiment of the disclosure. It should be mentioned that the reference numbers and some content in the embodiment depicted in FIG. 3 are derived from the reference numbers and some content in the embodiment depicted in FIG. 1, where the same or similar reference numbers serve to represent the same or similar components, and the description of the same technical content is omitted. For the description of the omitted part, reference may be made to the foregoing embodiments, which will not be repeated here.

The main difference between a semiconductor device 10B depicted in FIG. 3 and the semiconductor device 10A depicted in FIG. 1 lies in that the semiconductor device 10B further includes a fourth thin film transistor TFT4 between the oxide insulation layer 130 and the substrate 100.

With reference to FIG. 3, the semiconductor device 10B includes the substrate 100, the first SiN layer 110, a thin film transistor (TLT) component layer FL, the second SiN layer 120, a third SiN layer 112, the oxide insulation layer 130, the first metal oxide layer OS1, the second metal oxide layer OS2, the third metal oxide layer OS3, the gate dielectric layer 140, the interlayer dielectric layer 150, the first gate G1, the second gate G2, the third gate G3, the first source S1, the first drain D1, the second source S2, the second drain D2, the third source S3, the third drain D3, a first contact terminal TM1, a second contact terminal TM2, and a third contact terminal TM3. The TLT component layer FL includes an oxide insulation layer 132, a silicon semiconductor layer PS, a gate dielectric layer 142, a fourth gate G4, a dielectric layer 144, a fourth source S4, a fourth drain D4, a first capacitor electrode E1, a second capacitor electrode E2, a third capacitor electrode E3, a fourth capacitor electrode E4, a shielding metal layer SM, and a passivation layer 152.

With reference to FIG. 3, the first SiN layer 110 is located on or above the substrate 100. In some embodiments, other insulation layers, conductive layers, or semiconductor layers are included between the first SiN layer 110 and the substrate 100, which should however not be construed as a limitation in the disclosure. In this embodiment, the first SiN layer 110 is directly formed on the substrate 100. The first SiN layer 110 is adapted to prevent metal ions in the substrate 100 from being diffused upward in the manufacturing process, thereby preventing the silicon semiconductor layer and the metal oxide layer from being affected by the metal ions in the substrate 100.

The oxide insulation layer 132 is located on the first SiN layer 110. In this embodiment, the oxide insulation layer 132 directly contacts the upper surface of the first SiN layer 110. A material of the oxide insulation layer 132 is, for instance, silicon oxide, silicon oxynitride, or any other suitable insulation material.

The silicon semiconductor layer PS and the first capacitor electrode E1 are located on the oxide insulation layer 132. The silicon semiconductor layer PS and the first capacitor electrode E1 belong to the same patterned film layer and include the same material. The silicon semiconductor layer PS includes a source region sr4, a drain region dr4, and a channel region ch4 located between the source region sr4 and the drain region dr4. In some embodiments, the source region sr4, the drain region dr4, and the first capacitor electrode E1 are doped to have a resistivity lower than that of the channel region ch4.

The gate dielectric layer 142 is located on the silicon semiconductor layer PS and the first capacitor electrode E1. In some embodiments, a material of the gate dielectric layer 142 includes silicon oxide, silicon oxynitride, hafnium oxide, aluminum oxide, or any other suitable material.

The fourth gate G4, the second capacitor electrode E2, and the shielding metal layer SM are located on the gate dielectric electrode layer 142. The fourth gate G4 and the second capacitor electrode E2 are respectively overlapped with the silicon semiconductor layer PS and the first capacitor electrode E1 in the normal direction ND of the upper surface of the substrate 100. The shielding metal layer SM is located between the third metal oxide layer OS3 and the substrate 100 and adapted to avoid a light beam passing through the substrate 100 from irradiating the third metal oxide layer OS3. In some embodiments, the fourth gate G4, the second capacitor electrode E2, and the shielding metal layer SM belong to the same patterned film layer and include the same material (e.g., metal). In this embodiment, a width of the shielding metal layer SM is greater than a width of the third metal oxide layer OS3, which should however not be construed as a limitation in the disclosure. In other embodiments, the width of shielding metal layer SM is less than or equal to the width of third metal oxide layer OS3.

The dielectric layer 144 is located on the fourth gate G4, the second capacitor electrode E2, and the shielding metal layer SM. In some embodiments, a material of the dielectric layer 144 includes silicon oxide, SiN, silicon oxynitride, hafnium oxide, aluminum oxide, or any other suitable material.

The fourth source S4, the fourth drain D4, the third capacitor electrode E3, and the fourth capacitor electrode E4 are located on the dielectric layer 144. The fourth drain D4 and the fourth source S4 are electrically connected to the drain region dr4 and the source region sr4 of the silicon semiconductor layer PS, respectively. The third capacitor electrode E3 and the fourth capacitor electrode E4 are electrically connected to the first capacitor electrode E1 and the second capacitor electrode E2, respectively. In some embodiments, the fourth source S4, the fourth drain D4, the third capacitor electrode E3, and the fourth capacitor electrode E4 belong to the same patterned film layer and include the same material (e.g., metal).

In this embodiment, the fourth thin film transistor TFT4 includes the silicon semiconductor layer PS, the fourth gate G4, the fourth source S4, and the fourth drain D4. The fourth thin film transistor TFT4 is located between the oxide insulation layer 130 and the first SiN layer 110.

The passivation layer 152 is located above the substrate 100. In this embodiment, the passivation layer 152 is located on the fourth source S4, the fourth drain D4, the third capacitor electrode E3, and the fourth capacitor electrode E4. The passivation layer 152 covers the fourth source S4, the fourth drain D4, the third capacitor electrode E3, and the fourth capacitor electrode E4. In some embodiments, a material of the passivation layer 152 includes silicon oxide, SiN, silicon oxynitride, hafnium oxide, aluminum oxide, or other insulation materials.

The second SiN layer 120 and the third SiN layer 112 are located on the passivation layer 152. In some embodiments, a lower surface of the third SiN layer 112 and a lower surface of the second SiN layer 120 directly contact an upper surface of the passivation layer 152. In this embodiment, the first SiN layer 110, the second SiN layer 120, and the third SiN layer 112 all include a hydrogen element. For instance, the gas applied for depositing the first SiN layer 110, the second SiN layer 120, and the third SiN layer includes a hydrogen element, so that all of the first SiN layer 110, the second SiN layer 120, and the third SiN layer 130 include the hydrogen element. The process parameters of depositing the second SiN layer 120 are different from the process parameters of depositing the first SiN layer 110 and the third SiN layer 112, and the hydrogen concentration of the second SiN layer 120 is lower than that of the first SiN layer 110 and that of the third SiN layer 112. In some embodiments, the hydrogen concentration of the first SiN layer 110 and the hydrogen concentration of the third SiN layer 112 are higher than or equal to 20 at % and lower than or equal to 35 at %, and the hydrogen concentration of the second SiN layer 120 is higher than or equal to 5 at % and lower than 20 at %. In some embodiments, the density of the second SiN layer 120 is greater than or equal to 2.75 $g/cm^3$.

The third SiN layer 112 is adapted to prevent the metal in the TLT component layer FL from being diffused upward in the manufacturing process, thereby preventing the metal oxide layer from being affected by the metal in the TLT component layer FL.

According to some embodiments, in the process of depositing the second SiN layer 120, the resultant residual stress to the underlying components (e.g., the passivation layer 152) is greater than the resultant residual stress to the underlying component (e.g., the passivation layer 152) in the process of depositing the third SiN layer 112; therefore, in order to reduce damages to the underlying components in the process of depositing the second SiN layer 120, the thickness t2 of the second SiN layer 120 is less than a thickness t4 of the third SiN layer 112. In addition, the thickness t2 of the second SiN layer 120 is also less than the thickness t1 of the first SiN layer 110. In some embodiments, the thickness t1 of the first SiN layer 110, the thickness t2 of the second SiN layer 120, and the thickness t4 of the third SiN layer 112 are 100 angstroms to 3000 angstroms.

The oxide insulation layer 130 is located on the third SiN layer 112 and the second SiN layer 120. In this embodiment, the oxide insulation layer 130 directly contacts the upper surface of the third SiN layer 112 and the upper surface of the second SiN layer 120.

The first metal oxide layer OS1, the second metal oxide layer OS2, and the third metal oxide layer OS3 are located on the oxide insulation layer 130. The second SiN layer 120 is located between the first metal oxide layer OS1 and the substrate 100. The third SiN layer 112 is located between the second metal oxide layer OS2 and the substrate 100 and between the third metal oxide layer OS3 and the substrate 100. The third SiN layer 112 is not overlapped with the first metal oxide layer OS1 in the normal direction ND of the upper surface of the substrate 100. The second SiN layer 120 is not overlapped with the second metal oxide layer OS2 and the third metal oxide layer OS3 in the normal direction ND of the upper surface of the substrate 100.

The gate dielectric layer 140 is located on the first metal oxide layer OS1, the second metal oxide layer OS2, and the third metal oxide layer OS3.

The first gate G1, the second gate G2, and the third gate G3 are located on the gate dielectric layer 140 and are respectively overlapped with the first metal oxide layer OS1, the second metal oxide layer OS2, and the third metal oxide layer OS3 in the normal direction ND of the upper surface of the substrate 100.

The interlayer dielectric layer 150 is located on the gate dielectric layer 140. The interlayer dielectric layer 150 covers the first gate G1, the second gate G2, and the third gate G3.

The first source S1, the first drain D1, the second source S2, the second drain D2, the third source S3, the third drain D3, the first contact terminal TM1, the second contact terminal TM2, and the third contact terminal TM3 are located on the interlayer dielectric layer 150. The first source Si and the first drain D1 are electrically connected to the source region sr1 and the drain region dr1 of the first metal oxide layer OS1. The second source S2 and the second drain D2 are electrically connected to the source region sr2 and the drain region dr2 of the second metal oxide layer OS2. The third source S3 and the third drain D3 are electrically connected to the source region sr3 and the drain region dr3 of the third metal oxide layer OS3. The third source S3 is further electrically connected to the fourth capacitor electrode E4. The first contact terminal TM1 is electrically connected to the third capacitor electrode E3. The second contact terminal TM2 and the third contact terminal TM3 are electrically connected to the fourth drain D4 and the fourth source S4, respectively.

In view of the above, the second SiN layer 120 may mitigate the impact of the hydrogen element on the first metal oxide layer OS1, thereby reducing the hydrogen concentration of the first metal oxide layer OS1. In addition, according to this embodiment, the first metal oxide layer OS1 with a lower hydrogen concentration and the second metal oxide layer OS2 and the third metal oxide layer OS3 with a higher hydrogen concentration may be formed, so as to obtain the TFTs with different characteristics.

FIG. 4A to FIG. 4F are schematic cross-sectional views illustrating a manufacturing method of the semiconductor device 10B depicted in FIG. 3.

Figure 4A:
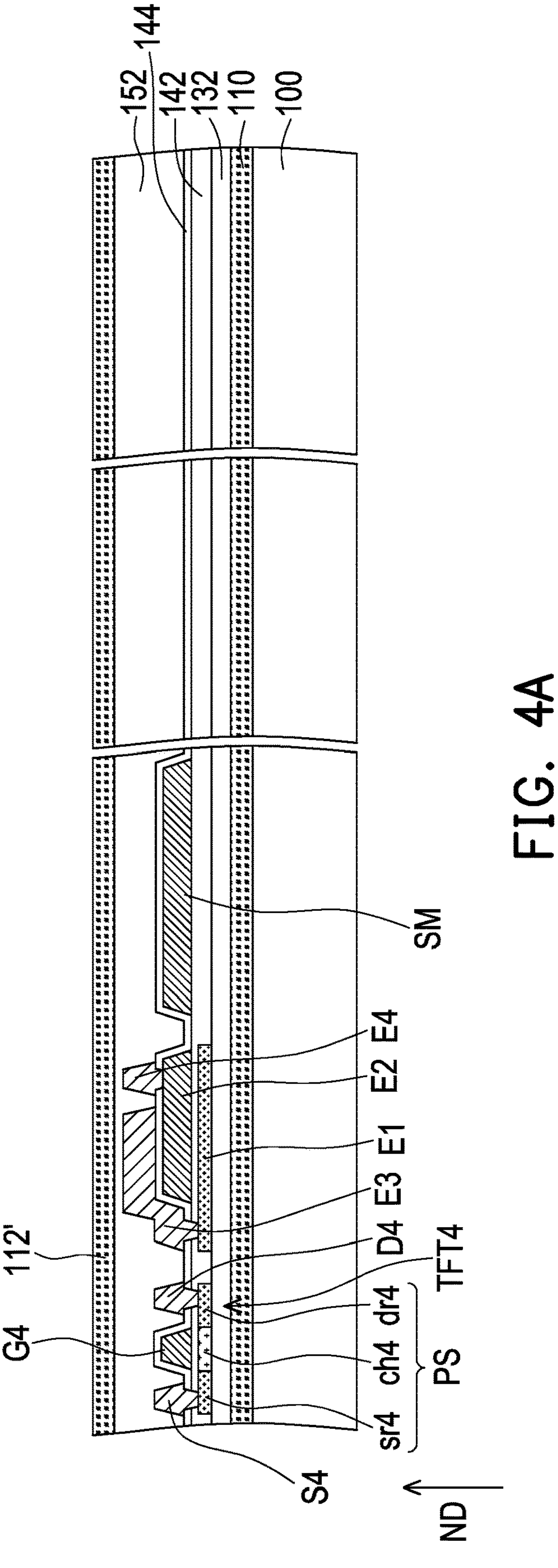
FIG. 4A to FIG. 4G are schematic cross-sectional views illustrating a manufacturing method of the semiconductor device depicted in FIG. 3.
Figure 4B:
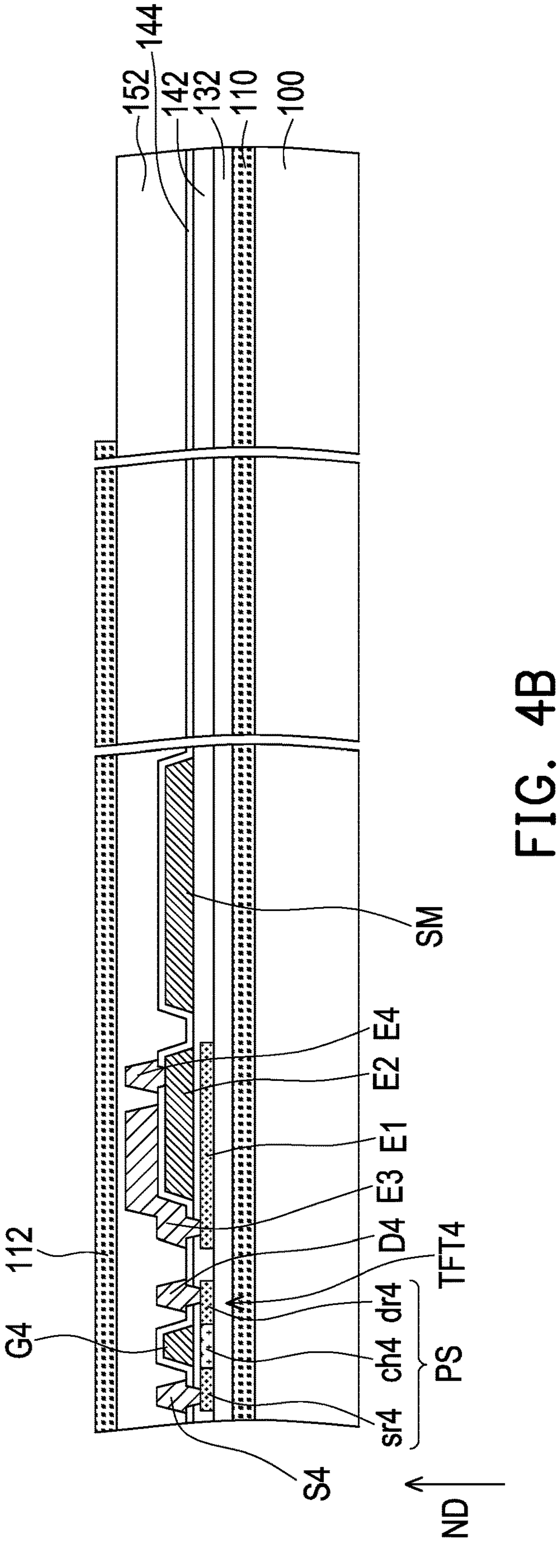

With reference to FIG. 4A and FIG. 4B, the passivation layer 152 is formed on the substrate 100. The third SiN layer 112 is formed on the passivation layer 152.

With reference to FIG. 4A, a SiN material layer 112' is formed on the passivation layer 152. For instance, the SiN material layer 112' blanketing the passivation layer 152 is formed by performing CVD or PECVD. In some embodiments, the method of depositing the SiN material layer 112' includes: providing $SiH_4$, $N_2$, and $NH_3$ on the substrate 100 and enabling them to react to generate SiN. In some embodiments, the flux of the $SiH_4$ for depositing the SiN material layer 112' is 150 sccm to 300 sccm, the flux of the $N_2$ for depositing the SiN material layer 112' is 5000 sccm to 12000 sccm, and the flux of the $NH_3$ for depositing the SiN material layer 112' is 100 sccm to 650 sccm. According to some embodiments, in the process of depositing the SiN material layer 112', the pressure is 120 Pa to 230 Pa (or 150 Pa to 230 Pa), the temperature is 260° C. to 380° C., and the power applied for depositing the SiN material layer 112' is 1000 W to 2000 W.

Next, with reference to FIG. 4B, hydrofluoric acid with a concentration of 0.5 wt % is applied at a temperature higher than or equal to 20° C. and lower than or equal to 40° C. to etch the SiN material layer 112', so as to obtain the third SiN layer 112, wherein an etching rate of the third SiN layer 112 is less than or equal to 2.5 nanometers/minutes. The third SiN layer 112 covers one portion of the upper surface of the passivation layer 152 and exposes the other portion of the upper surface of the passivation layer 152.

Figure 4C:
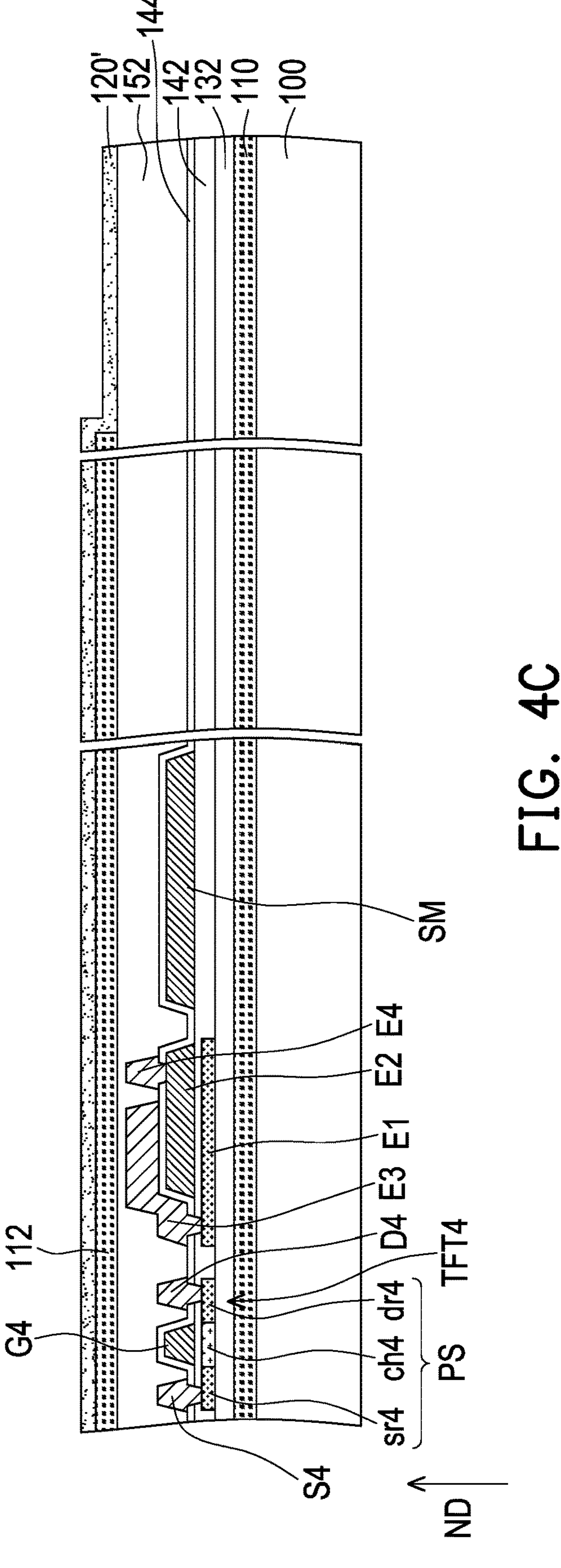
Figure 4D:
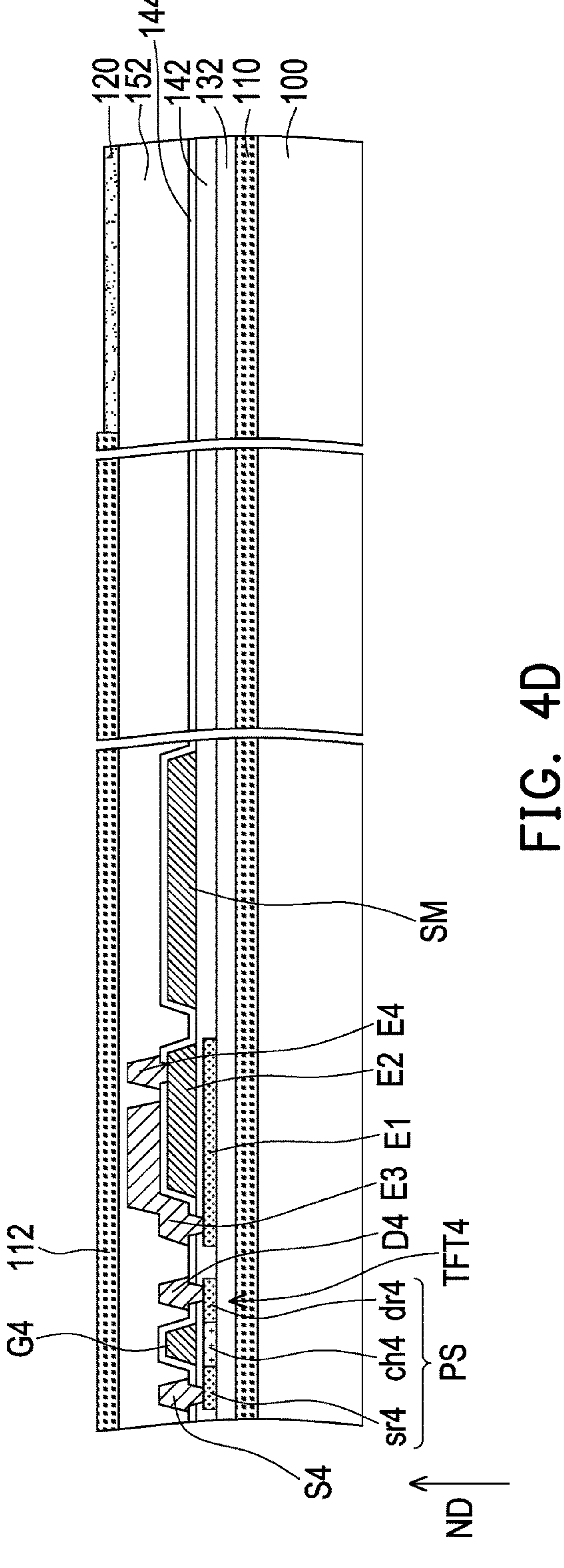

With reference to FIG. 4C and FIG. 4D, the second SiN layer 120 is formed on the first SiN layer 110.

First, as shown in FIG. 4C, the SiN material layer 120' is formed on the passivation layer 152. For instance, the SiN material layer 120' blanketing the passivation layer 152 and the third SiN layer 112 is formed by performing CVD or PECVD. In some embodiments, the method of depositing the SiN material layer 120' includes: providing $SiH_4$, $N_2$, and $NH_3$ on the substrate 100 and enabling them to react to generate SiN. In some embodiments, the flux of the $SiH_4$ for depositing the SiN material layer 120' is 150 sccm to 300 sccm, the flux of the $N_2$ for depositing the SiN material layer 120' is 9000 sccm to 12000 sccm, and the flux of the $NH_3$ for depositing the SiN material layer 120' is 60 sccm to 150 sccm. According to some embodiments, in the process of depositing the SiN material layer 120', the pressure is 70 Pa to 110 Pa, the temperature is 260° C. to 380° C., and the power applied for depositing the SiN material layer 120' is 2000 W to 3000 W.

Next, with reference to FIG. 4D, hydrofluoric acid with a concentration of 0.5 wt % is applied at a temperature higher than or equal to 20° C. and lower than or equal to 25° C. to etch the SiN material layer 120', so as to obtain the second SiN layer 120, wherein an etching rate of the second SiN layer 120 is less than or equal to 2 nanometers/minutes. The second SiN layer 120 covers a portion of the upper surface of the passivation layer 152. The lower surface of the third SiN layer 112 and the lower surface of the second SiN layer 120 are in direct contact with the upper surface of the passivation layer 152. In this embodiment, a sidewall of the second SiN layer 120 and a sidewall of the third SiN layer 112 are in contact with each other, which should however not be construed as a limitation in the disclosure. In other embodiments, the sidewall of the second SiN layer 120 and the sidewall of the third SiN layer 112 are separated from each other.

In this embodiment, the SiN material layer 120' is etched to expose the third SiN layer 112, which should however not be construed as a limitation in the disclosure. In other embodiments, the step of etching the SiN material layer 120' may be omitted. In other words, the second SiN layer 120 may cover the upper surface of the third SiN layer 112.

Figure 4E:
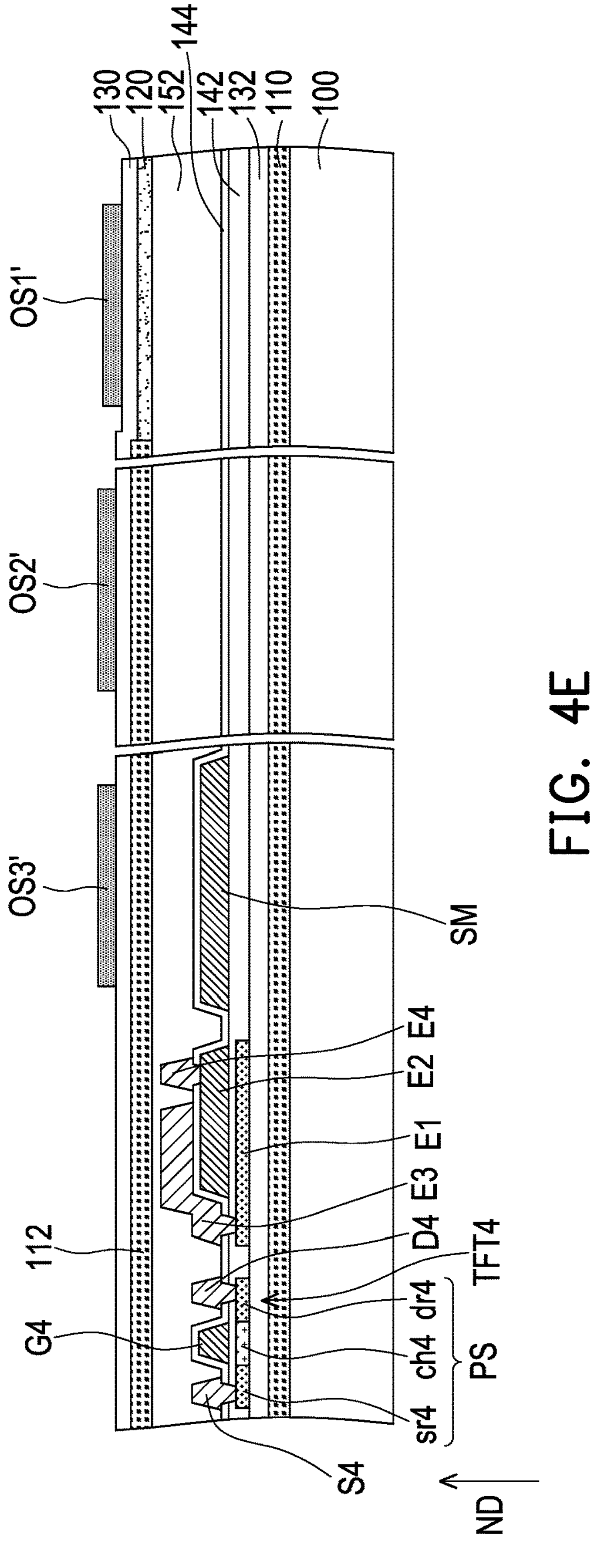

With reference to FIG. 4E, the oxide insulation layer 130 is formed on the third SiN layer 112 and the second SiN layer 120. The first metal oxide layer OS1', the second metal oxide layer OS2', and the third metal oxide layer OS3' are formed on the oxide insulation layer 130. In some embodiments, the first metal oxide layer OS1', the second metal oxide layer OS2', and the third metal oxide layer OS3' belong to the same patterned film layer.

The second SiN layer 120 is located between the first metal oxide layer OS1' and the substrate 100. The third SiN layer 112 is located between the second metal oxide layer OS2' and the substrate 100 and between the third metal oxide layer OS3' and the substrate 100.

Figure 4F:
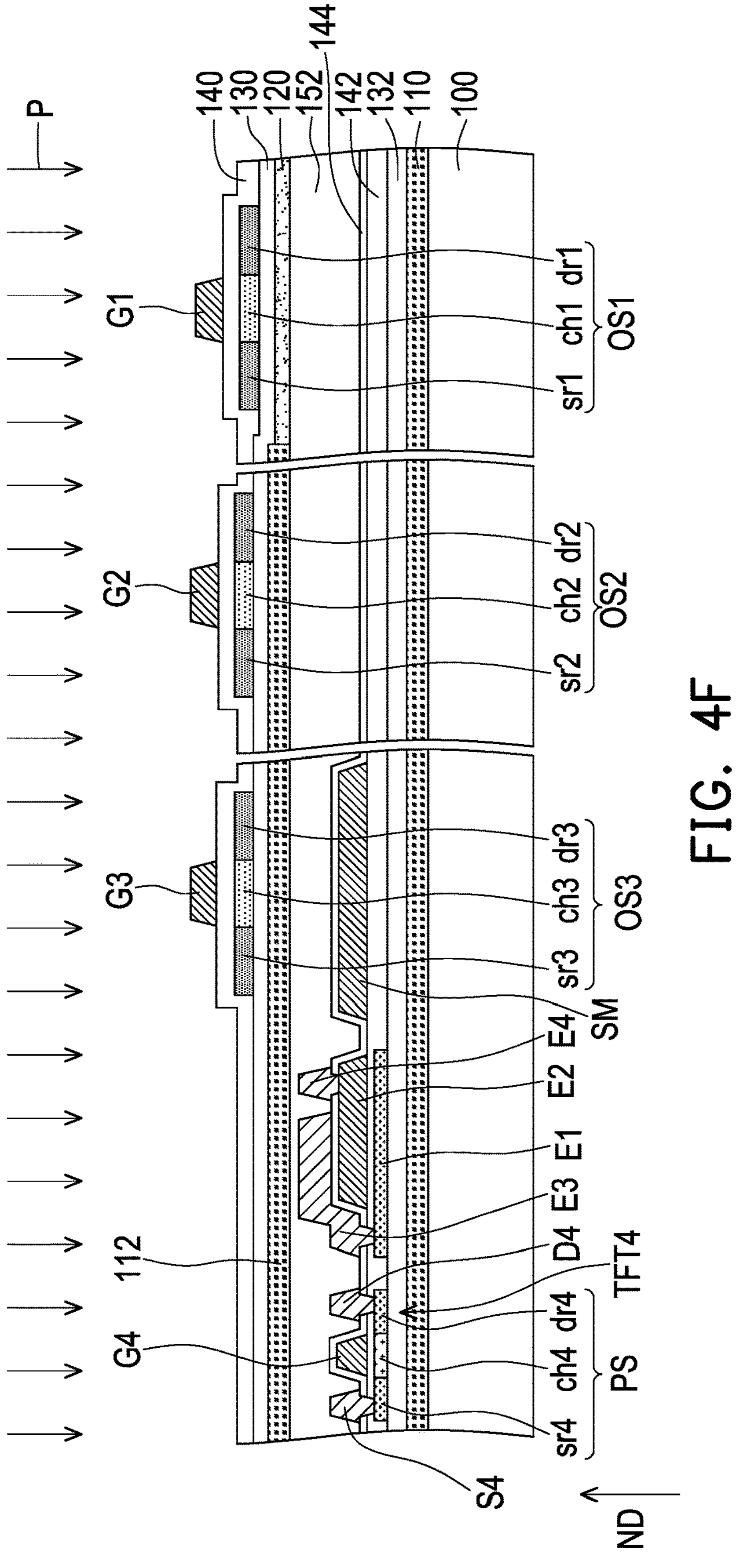

With reference to FIG. 4F, the gate dielectric layer 140 is formed on the first metal oxide layer OS1', the second metal oxide layer OS2', and the third metal oxide layer OS3'. The first gate G1, the second gate G2, and the third gate G3 are formed on the gate dielectric layer 140. In some embodiments, the first gate G1, the second gate G2, and the third gate G3 belong to the same patterned film layer.

The doping process P is performed on the first metal oxide layer OS1', the second metal oxide layer OS2', and the third metal oxide layer OS3' with use of the first gate G1, the second gate G2, and the third gate G3 as masks, so as to form the first metal oxide layer OS1, the second metal oxide layer OS2, and the third metal oxide layer OS3.

Figure 4G:
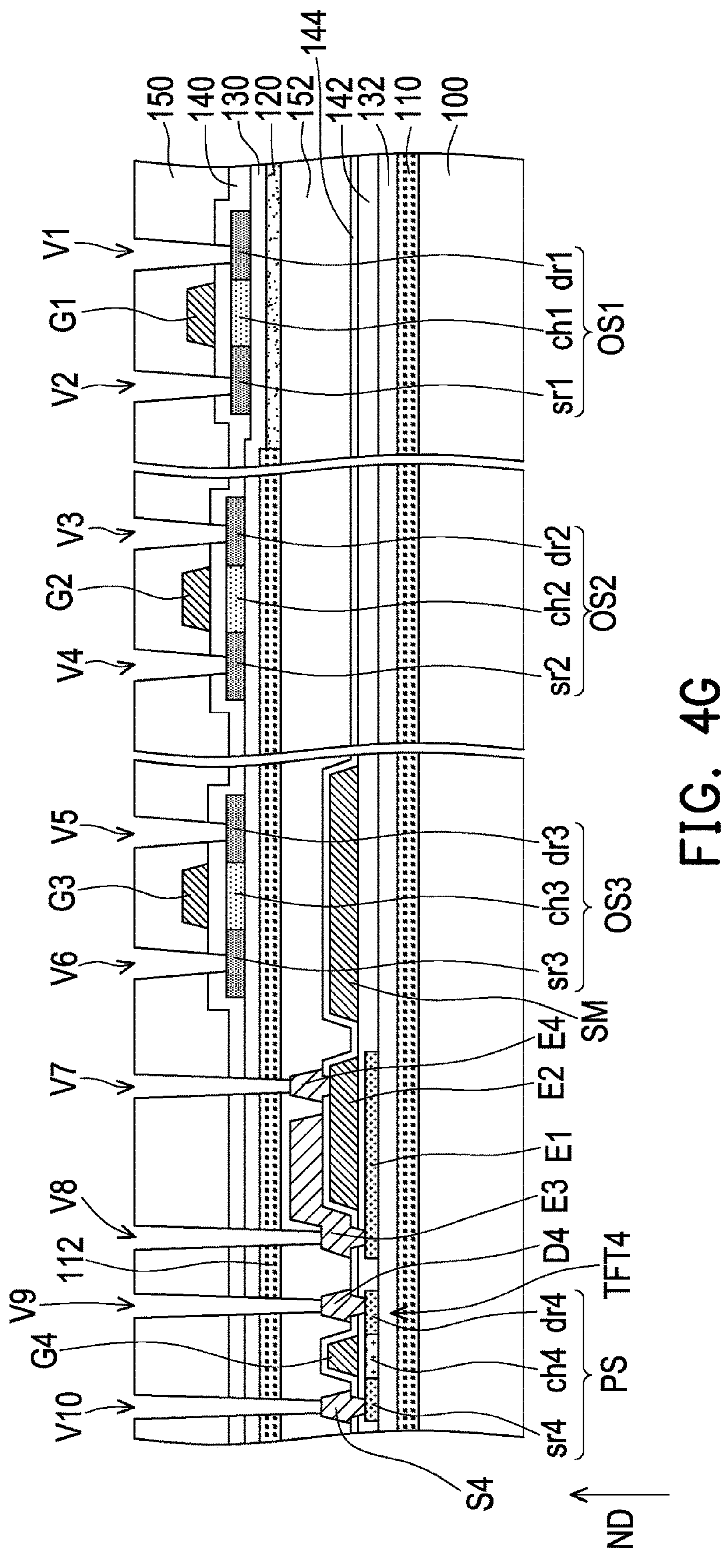

With reference to FIG. 4G, the interlayer dielectric layer 150 is formed on the gate dielectric layer 140. The interlayer dielectric layer 150 covers the first gate G1, the second gate G2, and the third gate G3. At least one etching process is performed to form the first contact hole V1, the second contact hole V2, the third contact hole V3, the fourth contact hole V4, the fifth contact hole V5, the sixth contact hole V6, a seventh contact hole V7, an eighth contact hole V8, a ninth contact hole V9, and a tenth contact hole V10 penetrating the interlayer dielectric layer 150 and the gate dielectric layer 140. The first contact hole V1 and the second contact hole V2 are overlapped with and expose the drain region dr1 and the source region sr1 of the first metal oxide layer OS1. The third contact hole V3 and the fourth contact hole V4 are overlapped with and expose the drain region dr2 and the source region sr2 of the second metal oxide layer OS2. The fifth contact hole V5 and the sixth contact hole V6 are overlapped with and expose the drain region dr3 and the source region sr3 of the third metal oxide layer OS3. The seventh contact hole V7 is overlapped with and exposes the fourth capacitor electrode E4. The eighth contact hole V8 is overlapped with and exposes the third capacitor electrode E3. The ninth contact hole V9 and the tenth contact hole V10 are overlapped with and expose the fourth drain D4 and the fourth source S4.

Finally, with reference to FIG. 3, the first source S1, the first drain D1, the second source S2, the second drain D2, the third source S3, the third drain D3, the first contact terminal TM1, the second contact terminal TM2, and the third contact terminal TM3 are formed on the interlayer dielectric layer 150. The first drain D1 and the first source S1 are located in the first contact hole V1 and the second contact hole V2, respectively. The second drain D2 and the second source S2 are located in the third contact hole V3 and the fourth contact hole V4, respectively. The third drain D3 and the third source S3 are located in the fifth contact hole V5 and the sixth contact hole V6, respectively, and the third source S3 is also located in the seventh contact hole V7. The first contact terminal TM1 is located in the eighth contact hole V8. The second contact terminal TM2 is located in the ninth contact hole V9. The third contact terminal TM3 is located in the tenth contact hole V10. So far, the fabrication of the semiconductor device 10B is substantially completed.

Figure 5:
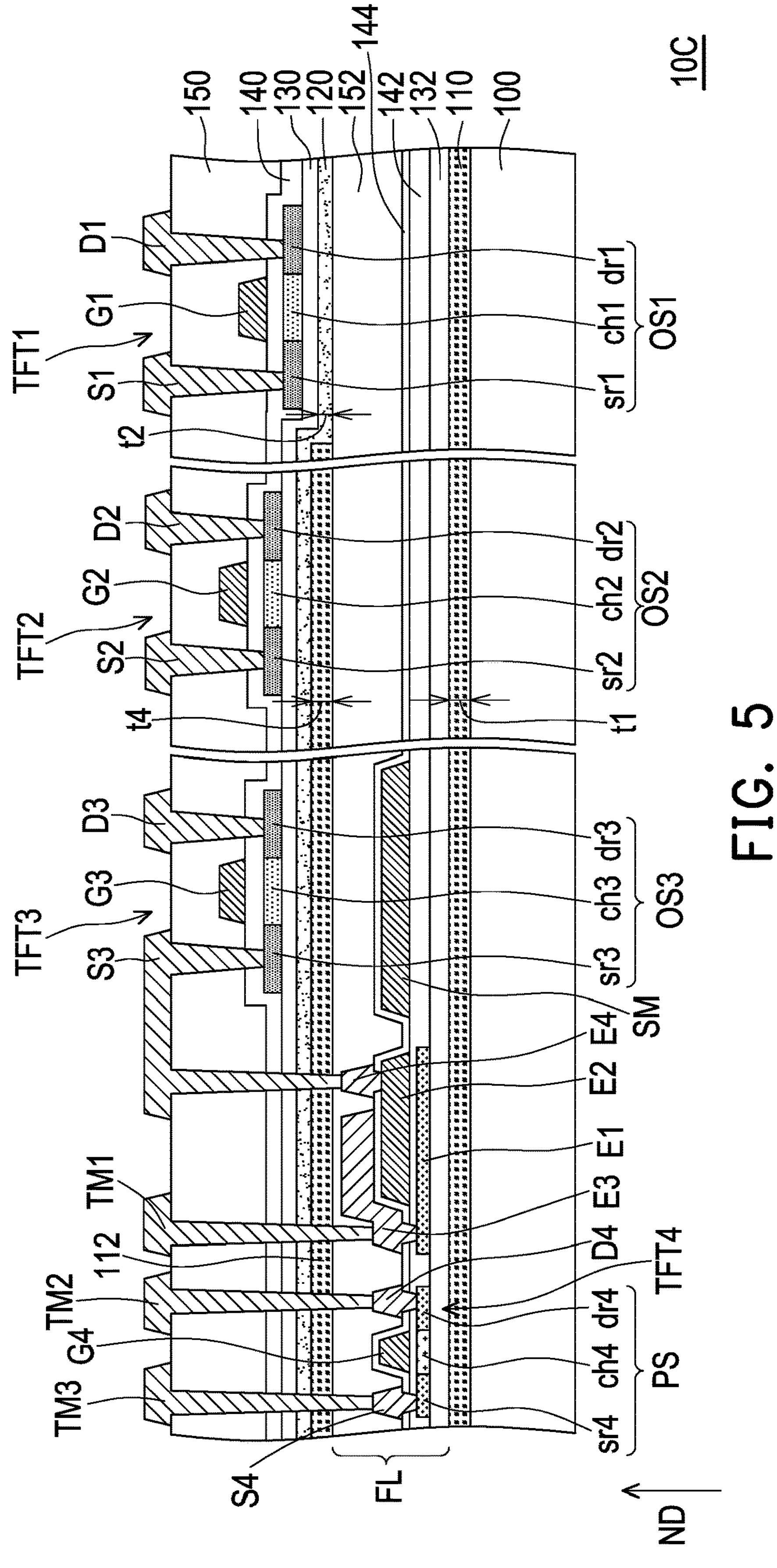
FIG. 5 is a schematic cross-sectional view illustrating a semiconductor device according to an embodiment of the disclosure.

FIG. 5 is a schematic cross-sectional view illustrating a semiconductor device according to an embodiment of the disclosure. It should be mentioned that the reference numbers and some content in the embodiment depicted in FIG. 5 are derived from the reference numbers and some content in the embodiment depicted in FIG. 3, where the same or similar reference numbers serve to represent the same or similar components, and the description of the same technical content is omitted. For the description of the omitted part, reference may be made to the foregoing embodiments, which will not be repeated here.

The main difference between a semiconductor device 10C depicted in FIG. 5 and the semiconductor device 10B depicted in FIG. 3 lies in that the second SiN layer 120 of the semiconductor device 10C covers the upper surface of the third SiN layer 112.

With reference to FIG. 5, in this embodiment, after the SiN material layer is deposited on the third SiN layer 112, the SiN material layer 120' is not etched to expose the third SiN layer 112. In other words, the process shown in FIG. 4D is not performed according to this embodiment, thereby saving the manufacturing cost.

In this embodiment, the third SiN layer 112 is located between the second metal oxide layer OS2 and the substrate 100 and between the third metal oxide layer OS3 and the substrate 100. The third SiN layer 112 is not overlapped with the first metal oxide layer OS1 in the normal direction ND of the upper surface of the substrate 100. The second SiN layer 120 is located between the first metal oxide layer OS1 and the substrate 100, between the second metal oxide layer OS2 and the substrate 100, and between the third metal oxide layer OS3 and the substrate 100.

In view of the above, the second SiN layer 120 may mitigate the impact of the hydrogen element on the first metal oxide layer OS1, thereby reducing the hydrogen concentration of the first metal oxide layer OS1.

Figure 6:
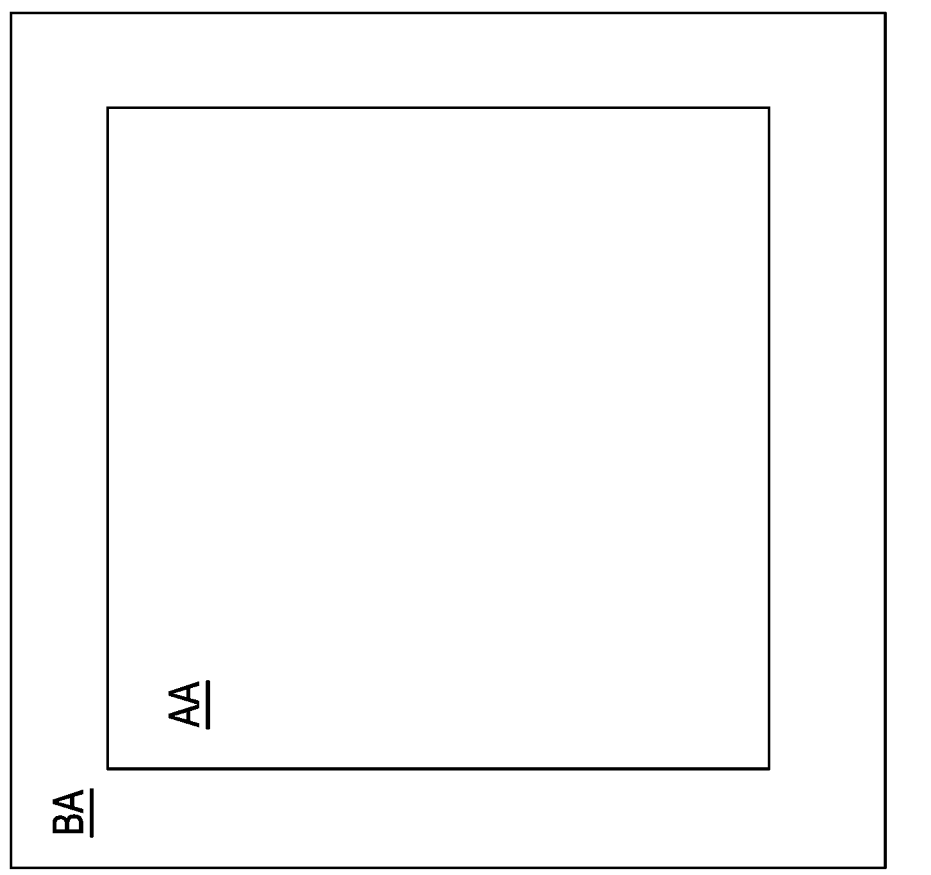
FIG. 6 is a schematic top view illustrating a semiconductor device according to an embodiment of the disclosure.

FIG. 6 is a schematic top view of a semiconductor device according to an embodiment of the disclosure. It should be mentioned that the reference numbers and some content in the embodiment depicted in FIG. 6 are derived from the reference numbers and some content in the embodiments depicted in FIG. 1, FIG. 3, and FIG. 5, where the same or similar reference numbers serve to represent the same or similar components, and the description of the same technical content is omitted. For the description of the omitted part, reference may be made to the foregoing embodiments, which will not be repeated here.

With reference to FIG. 6, in this embodiment, the semiconductor device includes a display region AA and a peripheral region BA.

With reference to FIG. 1 and FIG. 6, in some embodiments, the first thin film transistor TFT1 and the second thin film transistor TFT2 are disposed in the display region AA, and the third thin film transistor TFT3 is disposed in the peripheral region BA. In other embodiments, the second thin film transistor TFT2 is disposed in the display region AA, and the first thin film transistor TFT1 and the third thin film transistor TFT3 are disposed in the peripheral region BA. With reference to FIG. 3, FIG. 5, and FIG. 6, in some embodiments, the first thin film transistor TFT1, the third thin film transistor TFT3, and the fourth thin film transistor TFT4 are disposed in the display region AA, and the second thin film transistor TFT2 is disposed in the peripheral region BA. In other embodiments, the second thin film transistor TFT2, the third thin film transistor TFT3, and the fourth thin film transistor TFT4 are disposed in the display region AA, and the first thin film transistor TFT1 is disposed in the peripheral region BA.

The locations of the first thin film transistor TFT1, the second thin film transistor TFT2, the third thin film transistor TFT3, and the fourth thin film transistor TFT4 may be adjusted according to actual needs.

Figure 7A:
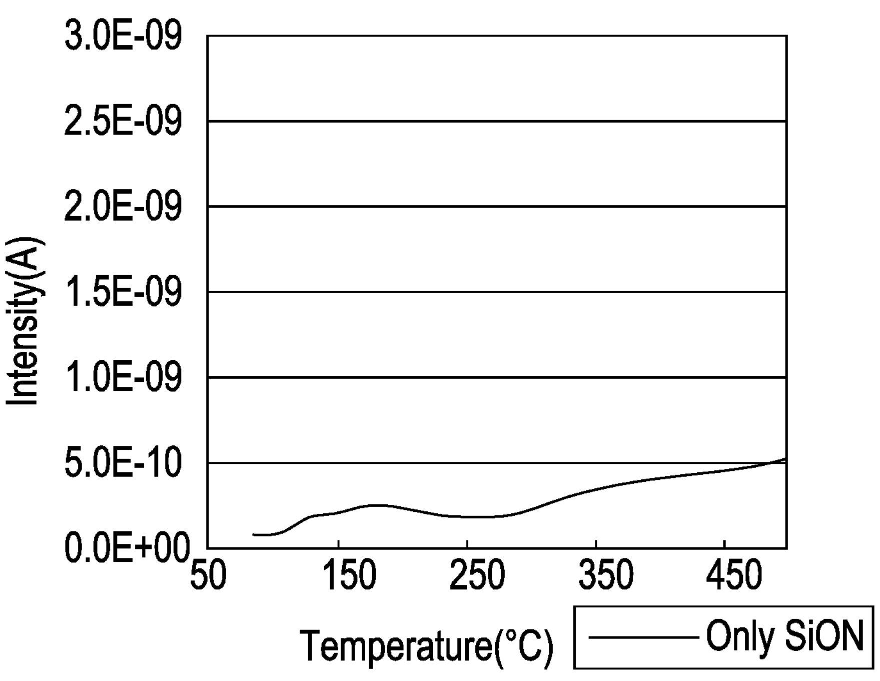
FIG. 7A is a thermal desorption spectroscopy (TDS) of hydrogen in a silicon oxynitride (SiON) layer.
Figure 7B:
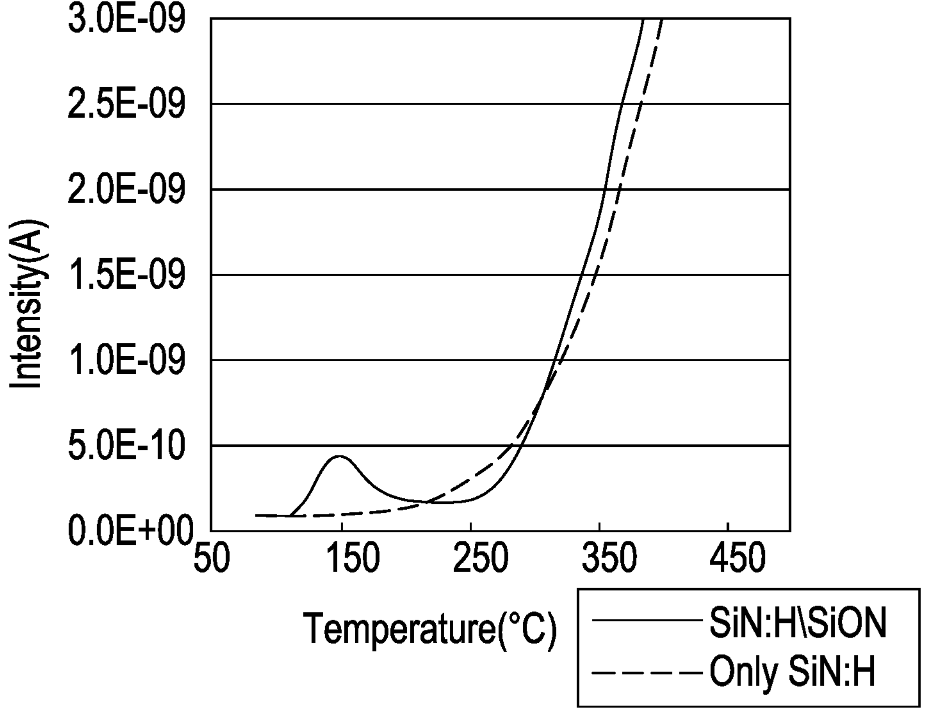
FIG. 7B is a TDS of hydrogen in a SiON layer and hydrogenated silicon nitride (SiN:H).

FIG. 7A is a thermal desorption spectroscopy (TDS) of hydrogen in a silicon oxynitride (SiON) layer. FIG. 7B is a TDS of hydrogen in a SiON layer and hydrogenated silicon nitride (SiN:H).

With reference to FIG. 7A, a SiON layer with a thickness of 100 nanometers is deposited on a base by performing PECVD. The flux of the $SiH_4$ for depositing the SiON layer is 290 sccm, and a flux of nitrous oxide for depositing the SiON layer is 4000 sccm. In the process of depositing the SiON layer, the pressure is 133 Pa, the temperature is 350° C., and the power applied for depositing the SiON layer is 1000 W. A test piece having the base where only the SiON layer is disposed is indicated as Only SiON in FIG. 7A.

With reference to FIG. 7B, SiN:H with a thickness of 300 nanometers is deposited on the base by performing PECVD. The flux of the $SiH_4$ for depositing the SiN:H is 200 sccm, the flux of the $N_2$ for depositing the SiN:H is 2000 sccm, and the flux of the $NH_3$ for depositing the SiN:H is 2000 sccm. In the process of depositing the SiN:H, the pressure is 200 Pa, the temperature is 220° C., and the power applied for depositing the SiN:H is 1000 W. Next, a SiON layer with a thickness of 100 nanometers is deposited on the SiN:H, and the method of depositing the SiON layer is the same as the method described above. A test piece having the base where only the SiN:H layer is disposed is indicated as Only SiN:H in FIG. 7B, and a test piece having the base where the SiN:H layer and the SiON layer are sequentially stacked is represented as SiN:H/SiON in FIG. 7B.

It may be learned from FIG. 7A and FIG. 7B that although the dissipation amount of hydrogen in the SiON layer itself is not significant, the SiON layer acting as a cap layer may not be able to considerably reduce the dissipation amount of hydrogen in the SiN:H layer. Specifically, with reference to FIG. 7B, as the temperature increases, there is no significant difference in the dissipation amount of hydrogen in the SiN:H layer covered by the SiON layer (SiN:H/SiON) and the dissipation amount of hydrogen in the SiN:H layer not covered by the SiON layer (Only SiN:H).

Figure 8A:
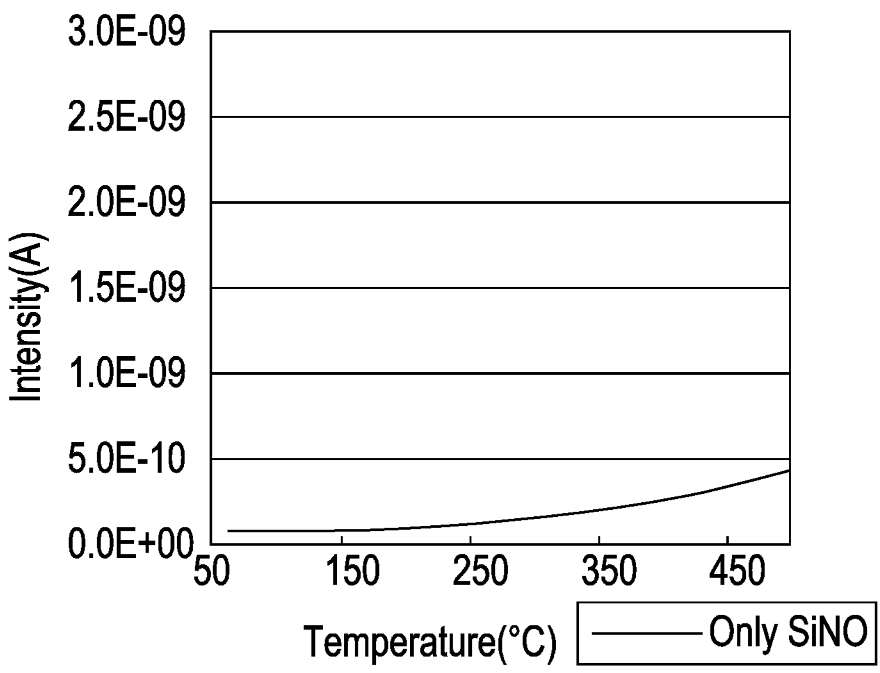
FIG. 8A is a TDS of hydrogen in a silicon nitride oxide (SiNO) layer.
Figure 8B:
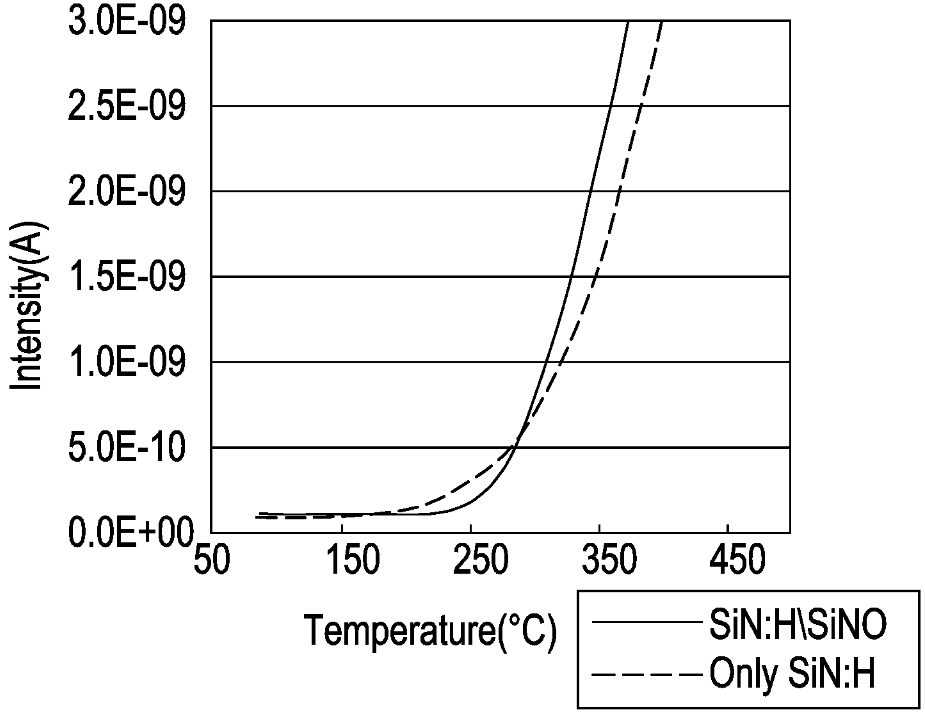
FIG. 8B is a TDS of hydrogen in a SiNO layer and SiN:H.

FIG. 8A is a TDS of hydrogen in a silicon nitride oxide (SiNO) layer. FIG. 8B is a TDS of hydrogen in a SiNO layer and SiN:H. The nitrogen concentration of the SiNO layer is higher than that of the SiON layer shown in FIG. 7A and FIG. 7B.

With reference to FIG. 8A, a SiNO layer with a thickness of 100 nanometers is deposited on a base by performing PECVD. The flux of the $SiH_4$ for depositing the SiNO layer is 150 sccm, the flux of the $N_2$ for depositing the SiNO layer is 5000 sccm, the flux of the $NH_3$ for depositing the SiNO layer is 100 sccm, and the flux of nitrous oxide for depositing the SiNO layer is 500 sccm. In the process of depositing the SiNO layer, the pressure is 300 Pa, the temperature when is 350° C., and the power applied for depositing the SiNO layer is 2500 W. A test piece having the base where only the SiNO layer is disposed is indicated as Only SiNO in FIG. 8A.

With reference to FIG. 8B, the SiN:H with a thickness of 300 nanometers is deposited on the base by performing PECVD. The process parameters applied for depositing the SiN:H are the same as those illustrated in FIG. 7B. Next, a SiNO layer with the thickness of 100 nanometers is deposited on the SiN:H, and the method of depositing the SiNO layer is the same as the method described above. A test piece having the base where only the SiN:H layer is disposed is indicated as Only SiN:H in FIG. 8B, and a test piece having the base where the SiN:H layer and the SiNO layer are sequentially stacked is represented as SiN:H/SiNO in FIG. 8B.

It may be learned from FIG. 8A and FIG. 8B that although the dissipation amount of hydrogen in the SiNO layer itself is not significant, the SiNO layer acting as a cap layer may not be able to considerably reduce the dissipation amount of hydrogen in the SiN:H layer. Specifically, with reference to FIG. 8B, as the temperature increases, there is no significant difference in the dissipation amount of hydrogen in the SiN:H layer covered by the SiNO layer (SiN:H/SiNO) and the dissipation amount of hydrogen in the SiN:H layer not covered by the SiNO layer (Only SiN:H).

Figure 9A:
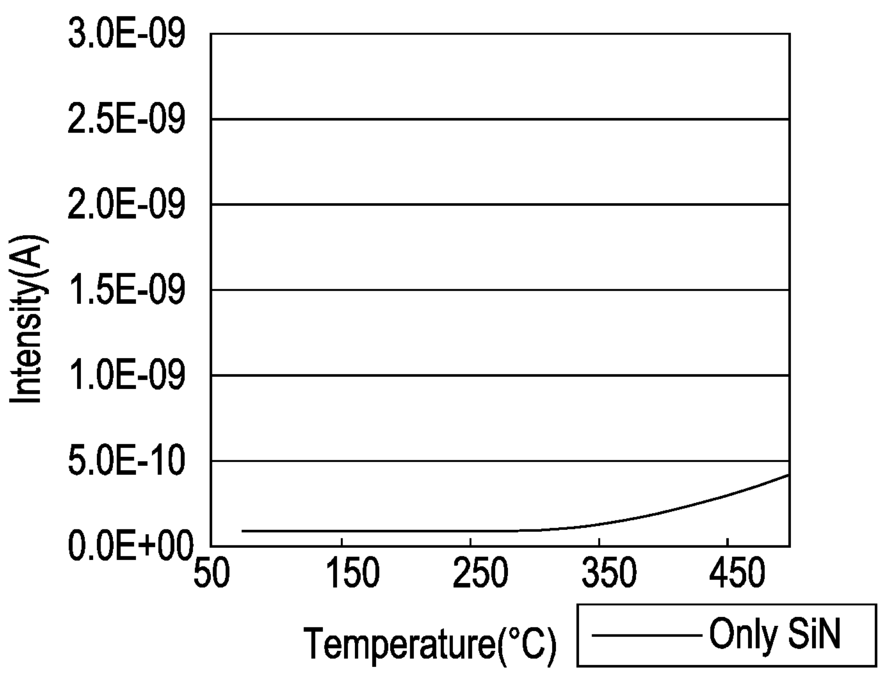
FIG. 9A is a TDS of hydrogen in a silicon nitride (SiN) layer.
Figure 9B:
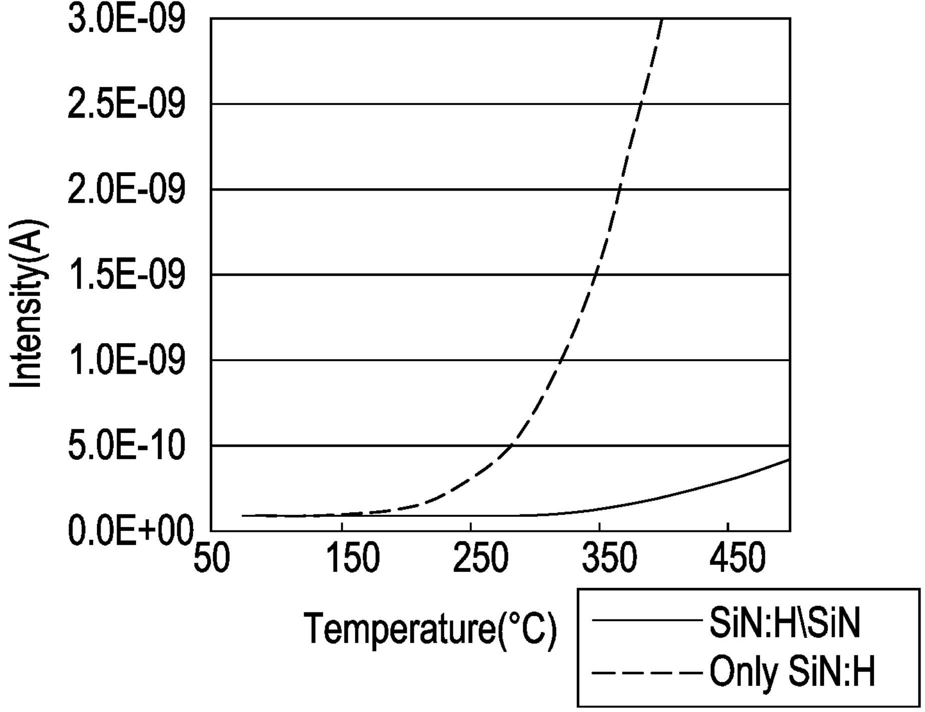
FIG. 9B is a TDS of hydrogen in a SiN layer and SiN:H.

FIG. 9A is a TDS of hydrogen in a SiN layer. FIG. 9B is a TDS of hydrogen in a SiN layer and SiN:H. In FIG. 9A and FIG. 9B, the hydrogen concentration of the SiN layer is lower than the hydrogen concentration of the SiN:H. For instance, the features associated with the SiN layer may be referred to as those associated with the second SiN layer provided in the previous embodiments, and the features associated with the SiN:H may be referred to as those associated with the first SiN layer provided in the previous embodiments.

With reference to FIG. 9A, a SiN layer with a thickness of 100 nanometers is deposited on a base by performing PECVD. The flux of the $SiH_4$ for depositing the SiN layer is 150 sccm, the flux of the $N_2$ for depositing the SiN layer is 5000 sccm, and the flux of the $NH_3$ for depositing the SiN layer is 100 sccm. In the process of depositing the SiN layer, the pressure is 200 Pa, the temperature is 350° C., and the power applied for depositing the SiN layer is 2000 W. A test piece having the base where only the SiN layer is disposed is indicated as Only SiN in FIG. 9A.

With reference to FIG. 9B, SiN:H with a thickness of 300 nanometers is deposited on the base by performing the PECVD. The process parameters applied for depositing the SiN:H are the same as those illustrated in FIG. 7B. Next, a SiN layer with a thickness of 100 nanometers is deposited on the SiN:H, and the method of depositing the SiN is the same as the method described above. A test piece having the base where only the SiN:H layer is disposed is indicated as Only SiN:H in FIG. 9B, and a test piece having the base where the SiN:H layer and the SiN layer are sequentially stacked is represented as SiN:H/SiN in FIG. 9B.

It may be learned from FIG. 9A and FIG. 9B that the dissipation amount of hydrogen in the SiN layer itself is not significant, and the SiN layer acting as a cap layer is able to considerably reduce the dissipation amount of hydrogen in the SiN:H layer. Specifically, as shown in FIG. 9B, as the temperature increases, there is a significant difference in the dissipation amount of hydrogen in the SiN:H layer covered by the SiN layer (SiN:H/SiNO) and the dissipation amount of hydrogen in the SiN:H layer not covered by the SiN layer (Only SiN:H).

In light of FIG. 7A to FIG. 9B, it may be learned that applying the SiN layer with a lower hydrogen concentration to cover the SiN layer with a higher hydrogen concentration may effectively reduce the dissipation of the hydrogen element.

To sum up, the second SiN layer of the semiconductor device provided in one or more embodiments of the disclosure may effectively prevent the hydrogen element in the first SiN layer from being diffused into the first metal oxide layer, thereby improving the reliability of the semiconductor device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:

a substrate;

a first silicon nitride layer, located on or above the substrate;

a passivation layer, located above the substrate;

a second silicon nitride layer, located above the first silicon nitride layer, wherein the first silicon nitride layer and the second silicon nitride layer both comprise a hydrogen element, a hydrogen concentration of the second silicon nitride layer is lower than a hydrogen concentration of the first silicon nitride layer, and a thickness of the second silicon nitride layer is less than a thickness of the first silicon nitride layer;

a third silicon nitride layer, wherein a lower surface of the third silicon nitride layer and a lower surface of the second silicon nitride layer are in direct contact with an upper surface of the passivation layer, wherein the third silicon nitride layer comprises a hydrogen element, the hydrogen concentration of the second silicon nitride layer is lower than a hydrogen concentration of the third silicon nitride layer, and the thickness of the second silicon nitride layer is less than a thickness of the third silicon nitride layer;

an oxide insulation layer, located on the second silicon nitride layer; and a first metal oxide layer, located on the oxide insulation layer, wherein the second silicon nitride layer is located between the first metal oxide layer and the substrate.

2. The semiconductor device according to claim 1, further comprising:

a second metal oxide layer, located on the oxide insulation layer, wherein the third silicon nitride layer is located between the second metal oxide layer and the substrate, and the third silicon nitride layer is not overlapped with the first metal oxide layer in a normal direction of an upper surface of the substrate.

3. The semiconductor device according to claim 2, further comprising:

a gate dielectric layer, located on the first metal oxide layer and the second metal oxide layer;

a first gate and a second gate, located on the gate dielectric layer and respectively overlapped with the first metal oxide layer and the second metal oxide layer in the normal direction of the upper surface of the substrate;

a first source and a first drain, electrically connected to the first metal oxide layer; and a second source and a second drain, electrically connected to the second metal oxide layer.

4. The semiconductor device according to claim 1, wherein the hydrogen concentration of the third silicon nitride layer is higher than or equal to 20 at % and lower than or equal to 35 at %, and the hydrogen concentration of the second silicon nitride layer is higher than or equal to 5 at % and lower than 20 at %.

5. The semiconductor device according to claim 1, wherein the thickness of the third silicon nitride layer and the thickness of the second silicon nitride layer are 100 angstroms to 3000 angstroms.

6. The semiconductor device according to claim 1, wherein a density of the second silicon nitride layer is greater than or equal to 2.75 $g/cm^3$.

7. The semiconductor device according to claim 1, further comprising:

a thin film transistor, located between the oxide insulation layer and the substrate.

8. The semiconductor device according to claim 7, wherein the thin film transistor is located between the oxide insulation layer and the first silicon nitride layer.

9. The semiconductor device according to claim 1, further comprising:

a second metal oxide layer, located on the oxide insulation layer, wherein a hydrogen concentration of a first channel region of the first metal oxide layer is lower than a hydrogen concentration of a second channel region of the second metal oxide layer.

10. A manufacturing method of a semiconductor device, comprising:

forming a first silicon nitride layer on or above a substrate;

forming a passivation layer above the substrate;

forming a first silicon nitride material layer above the passivation layer;

etching the first silicon nitride material layer to obtain a third silicon nitride layer;

forming a second silicon nitride layer above the first silicon nitride layer, wherein the first silicon nitride layer and the second silicon nitride layer both comprise a hydrogen element, a hydrogen concentration of the second silicon nitride layer is lower than a hydrogen concentration of the first silicon nitride layer, and a thickness of the second silicon nitride layer is less than a thickness of the first silicon nitride layer, wherein a lower surface of the third silicon nitride layer and a lower surface of the second silicon nitride layer are in direct contact with an upper surface of the passivation layer, wherein the third silicon nitride layer comprises a hydrogen element, the hydrogen concentration of the second silicon nitride layer is lower than a hydrogen concentration of the third silicon nitride layer, and the thickness of the second silicon nitride layer is less than a thickness of the third silicon nitride layer;

forming an oxide insulation layer on the second silicon nitride layer; and forming a first metal oxide layer on the oxide insulation layer, wherein the second silicon nitride layer is located between the first metal oxide layer and the substrate.

11. The manufacturing method according to claim 10, further comprising:

forming an oxide layer on the first silicon nitride layer, wherein the step of forming the second silicon nitride layer comprises:

forming a second silicon nitride material layer on the oxide layer; and etching the second silicon nitride material layer by applying hydrofluoric acid with a concentration of 0.5 wt % at a temperature higher than or equal to 20° C. and lower than or equal to 25° C. to obtain the second silicon nitride layer, wherein an etching rate of the second silicon nitride layer is less than or equal to 2 nanometers/minutes.

12. The manufacturing method according to claim 10, further comprising:

forming a second metal oxide layer on the oxide insulation layer;

forming a gate dielectric layer on the first metal oxide layer and the second metal oxide layer;

forming a first gate and a second gate on the gate dielectric layer, wherein the first gate and the second gate are respectively overlapped with the first metal oxide layer and the second metal oxide layer in a normal direction of an upper surface of the substrate;

performing a doping process on the first metal oxide layer and the second metal oxide layer with use of the first gate and the second gate as masks;

forming a first source and a first drain, wherein the first source and the first drain are electrically connected to the first metal oxide layer; and forming a second source and a second drain, wherein the second source and the second drain are electrically connected to the second metal oxide layer.

* * * * *